United States Patent
Tayanaka

(10) Patent No.: US 9,786,714 B2
(45) Date of Patent: Oct. 10, 2017

(54) SOLID-STATE IMAGING ELEMENT, METHOD FOR MANUFACTURING SOLID-STATE IMAGING ELEMENT, AND ELECTRONIC DEVICE

(71) Applicant: Sony Corporation, Tokyo (JP)

(72) Inventor: Hiroshi Tayanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/619,513

(22) Filed: Feb. 11, 2015

(65) Prior Publication Data

US 2015/0236066 A1 Aug. 20, 2015

(30) Foreign Application Priority Data

Feb. 18, 2014 (JP) ................................ 2014-028202

(51) Int. Cl.
*H01L 27/146* (2006.01)
(52) U.S. Cl.
CPC .. *H01L 27/14685* (2013.01); *H01L 27/14623* (2013.01); *H01L 27/14627* (2013.01); *H01L 27/14621* (2013.01)
(58) Field of Classification Search
CPC ............. H01L 25/167; H01L 27/14643; H01L 27/3227; H01L 31/02024; H01L 31/0203; H01L 31/0284; H01L 31/1032; H01L 31/107; H01L 21/00; H01L 21/70; H01L 21/746; H01L 21/7624; H01L 21/76297; H01L 21/77; H01L 21/82; H01L 21/8221; H01L 23/50; H01L 27/01; H01L 27/0203

USPC ... 257/233, 292, 59, 72, 222, 225, 232, 234, 257/414, 432–466, 114, 293, E27.13, 257/E27.133, E33.076, E31.058, E31.063, 257/E31.115, E27.14, E27.15, E25.032
See application file for complete search history.

(56) References Cited

U.S. PATENT DOCUMENTS

| | | | | |
|---|---|---|---|---|
| 6,829,008 B1 * | 12/2004 | Saga | ........................ | G02B 7/34 348/302 |
| 2013/0250153 A1 * | 9/2013 | Ishiwata | ........... | H01L 27/14621 348/308 |
| 2014/0110809 A1 * | 4/2014 | Kitamura | .......... | H01L 27/14623 257/435 |
| 2015/0035100 A1 * | 2/2015 | Tanida | .............. | H01L 27/14623 257/432 |

FOREIGN PATENT DOCUMENTS

| | | |
|---|---|---|
| JP | 2000-156823 A | 6/2000 |
| JP | 2003-007994 A | 1/2003 |
| JP | 2009-244862 A | 10/2009 |

* cited by examiner

*Primary Examiner* — Earl Taylor
*Assistant Examiner* — Samuel Park
(74) *Attorney, Agent, or Firm* — Sheridan Ross P.C.

(57) ABSTRACT

A solid-state imaging element includes a plurality of pixels which are two-dimensionally arranged and each of which includes a photoelectric conversion element, and a microlens which is provided on one or two or more first pixels out of the plurality of the pixels, in which an optical axis of the microlens extends inside a second pixel which is adjacent to the first pixel.

13 Claims, 25 Drawing Sheets

FIG. 15

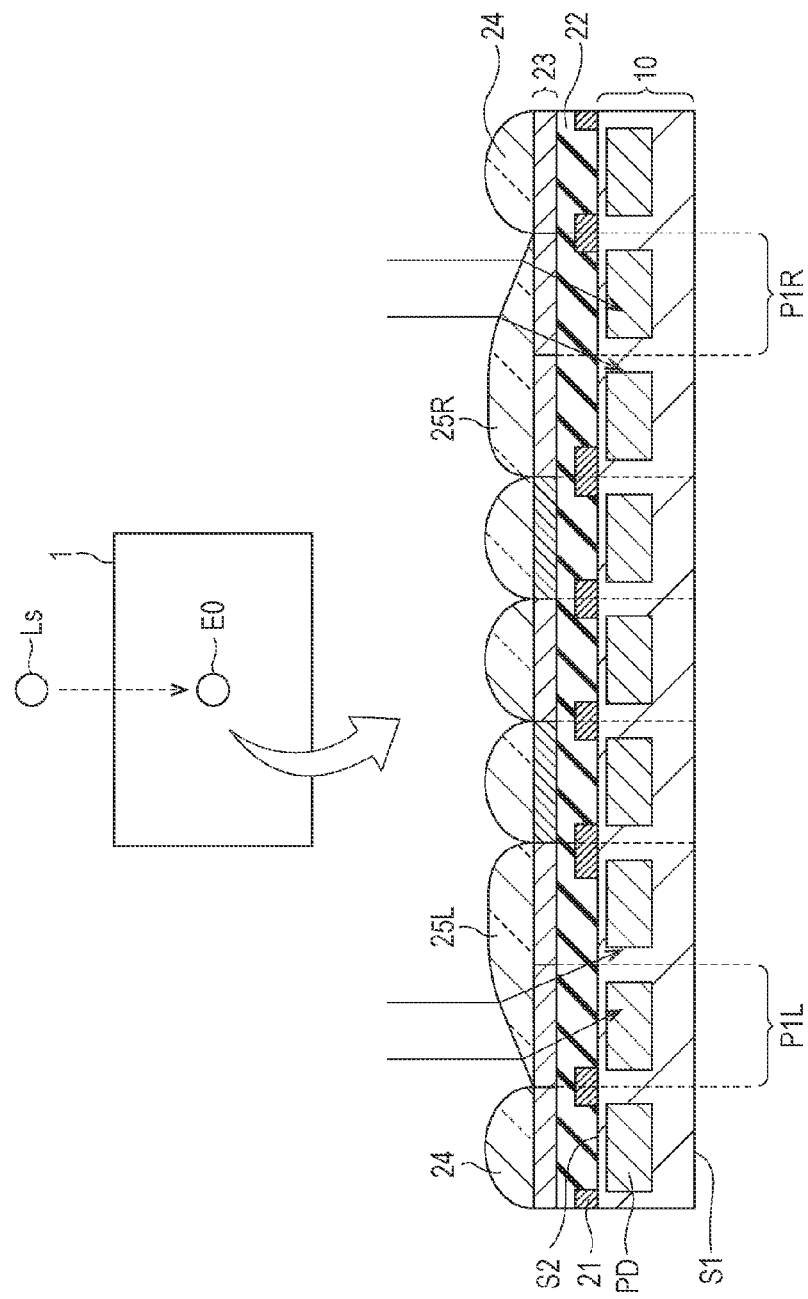

SOLID-STATE IMAGING ELEMENT, METHOD FOR MANUFACTURING SOLID-STATE IMAGING ELEMENT, AND ELECTRONIC DEVICE

CROSS REFERENCE TO RELATED APPLICATIONS

This application claims the benefit of Japanese Priority Patent Application JP 2014-028202 filed Feb. 18, 2014, the entire contents of which are incorporated herein by reference.

BACKGROUND

The present disclosure relates to a solid-state imaging element such as, for example, a charge coupled device (CCD) or a complementary metal oxide semiconductor (CMOS) image sensor, a method for manufacturing a solid-state imaging element, and an electronic device.

For a solid-state imaging element such as a CCD or CMOS image sensor, there are techniques which, without using a dedicated automatic focus detection (AF) sensor, realize AF (a so-called image surface phase difference AF) using a phase difference detecting method (for example, Japanese Unexamined Patent Application Publication Nos. 2000-156823, 2009-244862, and 2003-007994).

In the solid-state imaging element according to Japanese Unexamined Patent Application Publication Nos. 2000-156823, 2009-244862, and 2003-007994 described above, pixels for detecting a phase difference and pixels for generating a normal image are mixed and arranged and an on-chip lens (a microlens) and a light shielding layer which has a predetermined opening are provided in each of the pixels. In a pixel for detecting a phase difference, the optical axis of the microlens is designed so as to pass through the center axis of the pixel. In addition, the opening of the light shielding layer is formed so as to cover half of one side (the left half or the right half) of a light receiving surface of a photoelectric conversion element. It is possible to detect a phase difference using signals which are obtained from pixels with such a structure.

SUMMARY

However, in the method described above, the amount of light received is decreased and sensitivity of the pixels decreases since the opening area of a light shielding layer is narrowed in the pixels for detecting a phase difference.

It is desirable to provide a solid-state imaging element which is able to detect a phase difference while suppressing a decrease in sensitivity, a method for manufacturing a solid-state imaging element, and an electronic device.

According to an embodiment of the present disclosure, there is provided a first solid-state imaging element including a plurality of pixels which are two-dimensionally arranged and each of which includes a photoelectric conversion element and a microlens which is provided on one or two or more first pixels out of the plurality of the pixels, in which an optical axis of the microlens extends inside a second pixel which is adjacent to the first pixel.

In the first solid-state imaging element according to the embodiment of the present disclosure, the optical axis of the microlens which is provided on the first pixel out of a plurality of pixels extends inside the second pixel which is adjacent to the first pixel. Due to this, light which is incident on the microlens is refracted in a diagonal direction which is shifted from a pixel center axis by the microlens and is incident on the first pixel.

According to another embodiment of the present disclosure, there is provided a second solid-state imaging element including a plurality of pixels which are two-dimensionally arranged and each of which includes a photoelectric conversion element and a microlens which is provided on one or two or more first pixels out of the plurality of the pixels, in which the microlens has a convex surface on a light incident side and the convex surface includes an inclined surface in a portion which faces the first pixel.

In the second solid-state imaging element according to the embodiment of the present disclosure, a microlens which is provided on the first pixel out of a plurality of pixels has a convex surface on a light incident side and the convex surface includes an inclined surface in a portion which faces the first pixel. Due to this, light which is incident on the microlens is refracted in a diagonal direction which is shifted from the pixel center axis by the microlens and is incident on the first pixel.

According to still another embodiment of the present disclosure, there is provided a method for manufacturing a solid-state imaging element, the method including forming a plurality of pixels which are two-dimensionally arranged and each of which includes a photoelectric conversion element, and forming a microlens on one or two or more first pixels out of the plurality of the pixels, in which an optical axis of the microlens extends inside a second pixel which is adjacent to the first pixel.

In the method for manufacturing a solid-state imaging element according to the embodiment of the present disclosure, on a first pixel out of a plurality of pixels, a microlens is formed such that an optical axis extends inside a second pixel which is adjacent to the first pixel. Due to this, in the solid-state imaging element, light which is incident on the microlens is refracted in a diagonal direction which is shifted from a pixel center axis by the microlens and is incident on the first pixel.

According to still another embodiment of the present disclosure, there is provided an electronic device including the first solid-state imaging element according to the embodiment of the present disclosure described above.

According to the first solid-state imaging element and the electronic device according to the embodiments of the present disclosure, the optical axis of a microlens which is provided on the first pixel out of the plurality of pixels extends inside the second pixel which is adjacent to the first pixel. Due to this, it is possible for the light which is incident on the microlens to be refracted in a predetermined direction to be incident on the first pixel. Accordingly, it is possible to detect a phase difference without limiting the opening area by a light shielding layer. Thus, it is possible to detect a phase difference while suppressing a decrease in sensitivity.

According to the second solid-state imaging element according to the embodiment of the present disclosure, the microlens which is provided on the first pixel out of the plurality of pixels has the convex surface on the light incident side and the convex surface includes the inclined surface in a portion which faces the first pixel. Due to this, it is possible for the light which is incident on the microlens to be refracted in a predetermined direction to be incident on the first pixel. Accordingly, it is possible to detect a phase difference without limiting the opening area by a light shielding layer. Thus, it is possible to detect a phase difference while suppressing a decrease in sensitivity.

According to the method for manufacturing a solid-state imaging element according to the embodiment of the present disclosure, on the first pixel out of the plurality of pixels, the microlens is formed such that the optical axis extends inside the second pixel which is adjacent to the first pixel. Due to this, in a solid-state imaging element, it is possible for the light which is incident on the microlens to be refracted in a predetermined direction to be incident on the first pixel. Accordingly, it is possible to detect a phase difference without limiting the opening area by a light shielding layer. Thus, it is possible to realize a solid-state imaging element which is able to detect a phase difference while suppressing a decrease in the sensitivity.

Here, the content described above is one example according to an embodiment of the present disclosure. The effects according to an embodiment of the present disclosure are not limited to the above description and may be other different effects, or may further include other effects.

BRIEF DESCRIPTION OF THE DRAWINGS

FIG. 15 is a planar schematic diagram which represents one example of a pixel array of the solid-state imaging element shown in FIG. 14;

FIG. 23 is a schematic diagram which represents a part of a configuration of a solid-state imaging element according to a sixth embodiment of the present disclosure;

DETAILED DESCRIPTION OF EMBODIMENTS

Below, detailed description will be given of embodiments in the present disclosure with reference to the diagrams. Here, the order of the description is as described below.

1. First Embodiment (an example of a solid-state imaging element which has a second lens on a pixel for detecting a phase difference)
2. Second Embodiment (an example of a solid-state imaging element which is provided with a second lens in a pixel group unit formed of a plurality of pixels)
3. Third Embodiment (an example of a solid-state imaging element which has a diagonal pixel array)
4. Fourth Embodiment (an example of a solid-state imaging element which is provided with a light shielding layer for separating pixels)
5. Fifth Embodiment (an example of a solid-state imaging element where a shape of a second lens is different according to a pixel position)
6. Sixth Embodiment (an example of a solid-state imaging element where a type of a pixel, which is used for detecting a phase difference, is different according to a pixel position)
7. Seventh Embodiment (an example of a solid-state imaging element which has a dynamic range extension function)
8. Eighth Embodiment (an example of a solid-state imaging element which uses pixels of R and B for detecting a phase difference)
9. Application Example (an example of an electronic device (a camera))

First Embodiment

Configuration

Figure 1:
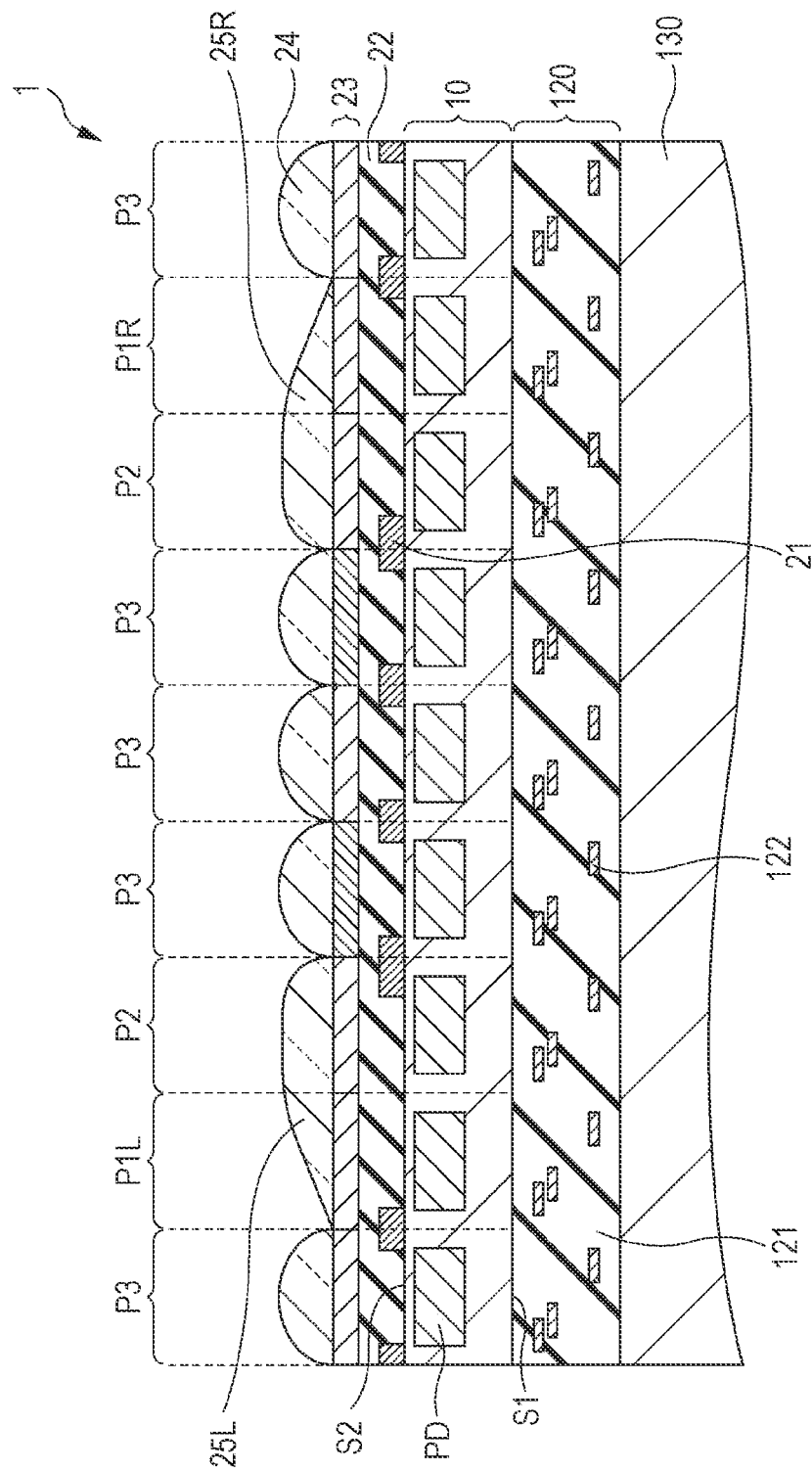
FIG. 1 is a cross-sectional diagram which represents a configuration of a solid-state imaging element according to a first embodiment of the present disclosure.
Figure 2:
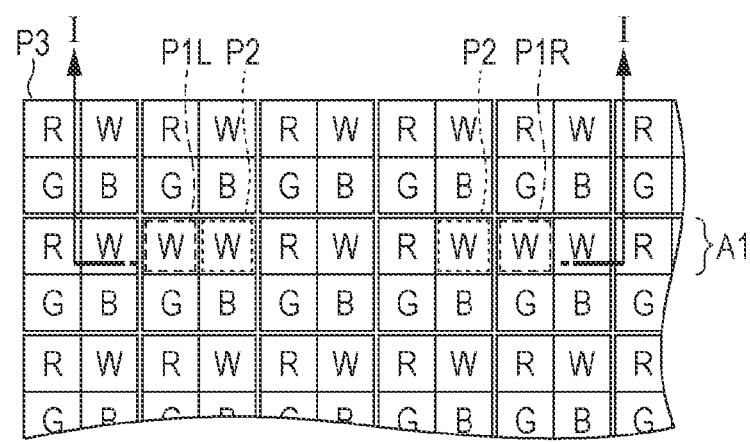
FIG. 2 is a planar schematic diagram which represents one example of a pixel array of the solid-state imaging element shown in FIG. 1.

FIG. 1 represents a cross-sectional configuration of a solid-state imaging element (a solid-state imaging element 1) of the first embodiment of the present disclosure. FIG. 2 represents one example of a pixel array of the solid-state imaging element 1. The solid-state imaging element 1 is, for example, a CCD or CMOS image sensor or the like and has a pixel structure which is able to realize a so-called image surface phase difference AF.

The solid-state imaging element 1 is formed by a plurality of pixels P (which include pixels P1L, P1R, P2, and P3 and which are simply referred to as pixels P in a case in which it is not necessary to make a particular distinction therebetween) being two-dimensionally arrayed on a substrate 130. In the solid-state imaging element 1, one or two or more pixels P1L and P1R for detecting a phase difference are arranged in a selective region in an imaging area.

The pixel P1L and the pixel P1R are used as a pair, for example, when detecting a phase difference and, for example, as shown in FIG. 2, are arranged in a predetermined pixel row A1 at predetermined pixel intervals. A phase difference is calculated based on a signal which is obtained from each of the pixels P1L and P1R. It is possible to realize an AF function by performing focus determination based on the calculated phase difference. For example, color filters with identical colors to each other are provided in the pixels P1L and P1R. For example, here, W pixels are used as the pixels P1L and P1R and a color filter 23W is provided in both of the pixels P1L and P1R.

The pixels P2 and P3 are pixels for generating an image. The pixel P2 out of these is a pixel which is adjacent to the pixel P1L or the pixel P1R for detecting a phase difference described above. In detail, the pixel P2 is provided to be adjacent to each of a right side of the pixel P1L (a side which faces the pixel P1R) and a left side of the pixel P1R (a side which faces the pixel P1L). The pixel P3 is provided in a region other than these pixels P1L, P1R, and P2. In this manner, in the present embodiment, the pixels P1L and P1R for detecting a phase difference and the pixels P2 and P3 for generating an image are mixed and arranged.

Each of the plurality of the pixels P has a photodiode PD (a photoelectric conversion element) which is formed inside a semiconductor layer (or a semiconductor substrate) 10, for example, formed of silicon (Si). The semiconductor layer 10 has a circuit forming surface (a front surface) S1 and a light incident surface (a rear surface) S2 which oppose each other. In addition, in the present embodiment, as schematically shown in FIG. 2, one pixel P is a pixel (an R pixel, a G pixel, a B pixel, or a W pixel) which acquires a signal based on any colored light of, for example, R (red), G (green), B (blue), or W (white). Here, the configuration shown in FIG. 1 is equivalent to the cross-sectional configuration taken along the arrows of the II-II line in FIG. 2.

Although omitted in the diagram, a floating diffusion (FD) for reading out a signal from the photodiode PD and a pixel circuit which includes a pixel transistor and the like are formed in the vicinity of the circuit forming surface S1 of the semiconductor layer 10. Examples of the pixel transistor include a transfer transistor, a reset transistor, an amplifier transistor, a selection transistor, and the like. A multilayer wiring layer 120 which includes a plurality of wirings 122 which are laminated via an interlayer insulating film 121 is provided between the circuit forming surface S1 and the substrate 130.

A light shielding layer 21 which has an opening section 21a is formed on the light incident surface S2 of the semiconductor layer 10 and a planarizing layer 22 is formed to cover the light shielding layer 21. A color filter layer 23 is provided on the planarizing layer 22 and a first lens 24 and second lenses 25L and 25R are provided over one or two or more pixels P (in one or two or more pixel units) on the color filter layer 23. Below, description will be given of the configuration of each section.

Figure 3A:
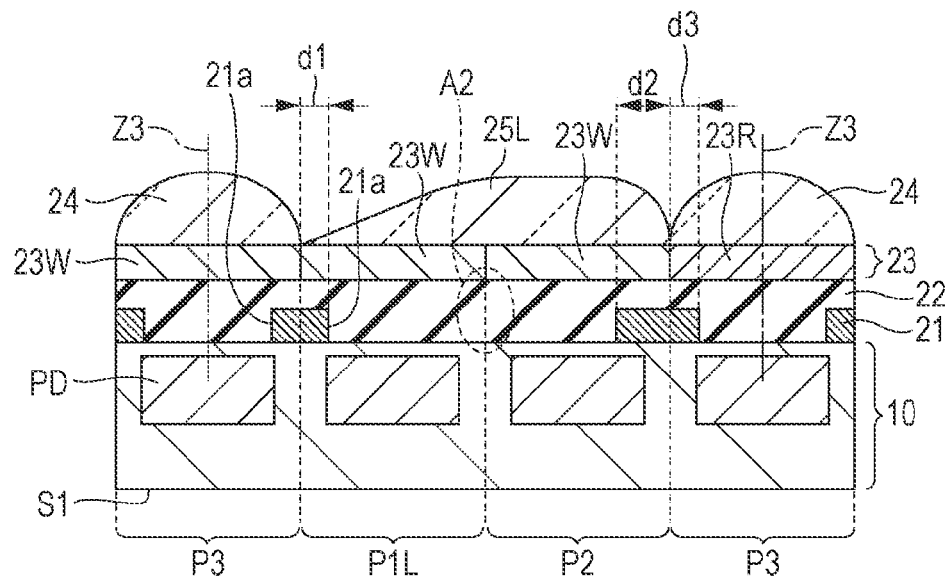
FIG. 3A is an enlarged cross-sectional diagram of a phase difference detecting pixel (L) and peripheral pixels thereof shown in FIG. 1.
Figure 3B:
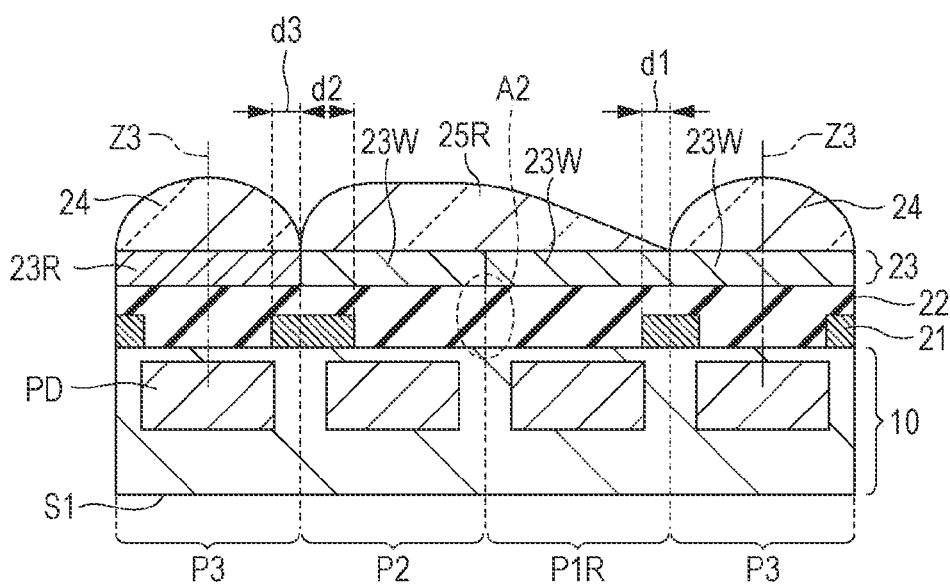
FIG. 3B is an enlarged cross-sectional diagram of a phase difference detecting pixel (R) and peripheral pixels thereof shown in FIG. 1.

FIG. 3A represents an enlarged cross-sectional configuration of the pixel P1L and the pixels P2 and P3 in the periphery thereof and FIG. 3B represents an enlarged cross-sectional configuration of the pixel P1R and the pixels P2 and P3 in the periphery thereof.

The photodiode PD is formed by being embedded in the vicinity of the light incident surface S2 inside the semiconductor layer 10. The photodiode PD is configured, for example, to include an n-type impurity diffusion layer which accumulates signal charges (for example, electrons). In addition, the photodiode PD may have a structure where the n-type impurity diffusion layer and a p-type impurity diffusion layer are alternately laminated.

The light shielding layer 21 suppresses crosstalk between each of the pixels P and has the opening section 21a which opposes the photodiode PD. In other words, the planar shape of the light shielding layer 21 along the light incident surface S2 is a grid pattern which corresponds to, for example, a pixel array. The light shielding layer 21 is configured by, for example, tungsten (W) or the like.

As shown in FIG. 3A and FIG. 3B, the light shielding layer 21 does not shield light in the region (region A2) between the pixel P1L and the pixel P2 and between the pixel P1R and the pixel P2 while shielding light in each of the regions between the pixel P1L and the pixel P3, between the pixel P2 and the pixel P3, and between the pixels P3. In other words, while one opening section 21a is provided in the pixel P3 to oppose one photodiode PD, one opening section 21a is provided in the pixels P1L and P2 to oppose two photodiodes PD.

In the light shielding layer 21, the size of the width (line width) d1 in the pixels P1L and P1R is not particularly limited. Here, in a general pixel for detecting a phase difference, light is shielded in one half side of the pixel in order to secure the left and right separation ratio. However, in the present embodiment, it is possible to detect a phase difference without limiting a light shielding region (details will be described below). In addition, the width d2 in the pixel P2 is designed so as to be larger than the width d3 in the pixel P3. That is, the light shielding area due to the light shielding layer 21 is large in the pixel P2 compared to the pixel P3.

The planarizing layer 22 is configured by, for example, a single layer film of silicon nitride (SiN), silicon oxide ($SiO_2$), silicon oxynitride (SiON), or the like, or a laminated film thereof.

The color filter layer 23 includes, for example, color filters 23R, 23G, 23B, and 23W of R (red), G (green), B (blue), and W (white) and each of these color filters is regularly arranged. In the present embodiment, for example, all of the color filters 23R, 23G, 23B, and 23W of R (red), G (green), B (blue), and W (white) are provided in a pixel unit. Here, there may be a configuration where a color filter is not provided in the W pixel. In the color filter layer 23, the pixel P1L (or the pixel P1R) and the pixel P2 which is adjacent thereto have color filters with identical colors to each other. Here, the color filter 23W is provided in all of the pixels P1L, P1R, and P2. In addition, the color filter layer 23 may also include other filters of, for example, cyan or magenta in addition to the colors described above.

The first lens 24 and the second lenses 25L and 25R are all so-called on-chip lenses and collect incident light toward the photodiode PD. The focal point and the optical axis of the first lens 24 and the second lenses 25L and 25R are set in appropriate positions according to the combination with other imaging lenses and the like inside the imaging apparatus, which are not shown in the diagram.

The first lens 24 is configured by a microlens with a typical shape and, here, is provided on one pixel P (the pixel P3 for generating an image). The optical axis of the first lens 24 substantially matches, for example, the center axis of the pixel P3 and additionally, the focal point is set in the vicinity of the light receiving surface of the photodiode PD inside the pixel P3.

The second lens 25L is different from the first lens 24 described above and is provided over two pixels P (the pixel P1L for detecting a phase difference and the pixel P2 which is adjacent thereto). The second lens 25R is provided over two pixels P (the pixel P1R for detecting a phase difference and the pixel P2 which is adjacent thereto).

Figure 4:
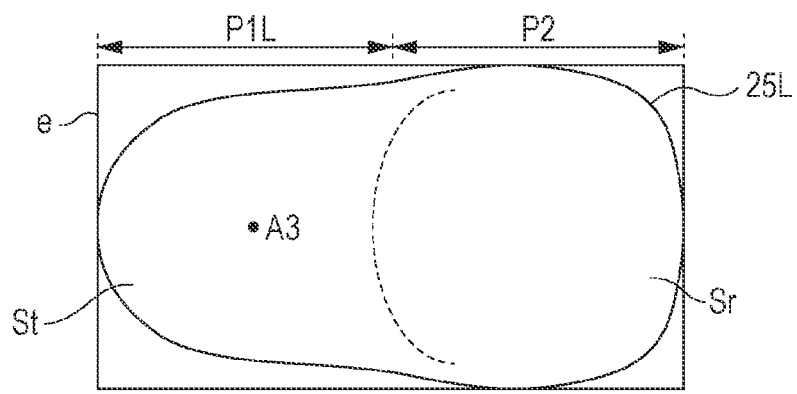
FIG. 4 is a schematic diagram where a second lens shown in FIG. 3A is viewed from a light incident side.
Figure 5A:
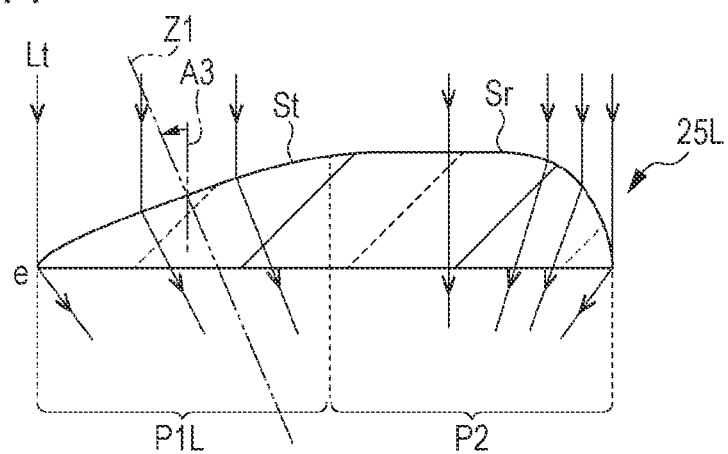
FIG. 5A is a cross-sectional diagram which represents a detailed configuration of the second lens shown in FIG. 3A.
Figure 5B:
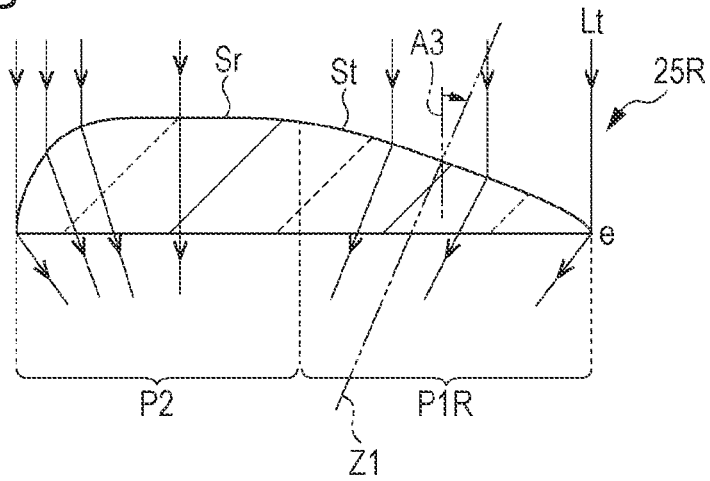
FIG. 5B is a cross-sectional diagram which represents a detailed configuration of the second lens shown in FIG. 3B.

FIG. 4 shows a schematic diagram where the second lens 25L is viewed from a light incident side. In addition, FIG. 5A schematically shows a cross-sectional configuration of the second lens 25L and a transmitted ray of light and FIG. 5B schematically shows a cross-sectional configuration of the second lens 25R and the transmitted ray of light.

The second lenses 25L and 25R have a convex surface on a light incident side and the convex surface includes a predetermined inclined surface St. That is, in the second lenses 25L and 25R, the convex surface on the light incident side is not a completely spherical surface (or not designed to be a spherical surface) and has a shape which is partially inclined diagonally.

In detail, in the convex surface described above of the second lens 25L, a portion which faces the pixel P2 includes a spherical surface (a surface with a spherical shape) Sr in at least a part and a portion which faces the pixel P1L includes the inclined surface St. The inclined surface St is gently inclined as a roof on one half side, for example, from a vicinity of a boundary between the pixel P1L and the pixel P2 toward an end section e of the pixel P1L. The inclined surface St may be a flat surface and may be a curved surface as long as the inclined surface St is a surface where approximately half or more of the incident light is refracted in a diagonal direction toward the pixel P2. In addition, the inclined surface St may have local unevenness (for example, unevenness and the like which are generated in a processing step).

Due to the shape of the second lens 25L, on the pixel P2, an optical axis of the second lens 25L (an optical axis of a portion which faces the pixel P2 (which is not shown in the diagram)) is formed to substantially match or be slightly shifted from the center axis of the pixel P2. However, incident light on this portion is mostly incident on the photodiode inside the pixel P2. On the other hand, on the pixel P1L, as shown in FIG. 5A, an optical axis Z1 of the second lens 25L (an optical axis of a portion which faces the pixel P1L) extends inside the pixel P2 (the optical axis Z1 faces toward the photodiode PD of the pixel P2 not the pixel P1). Due to this, in the second lens 25L, the light which is incident on the inclined surface St is easily refracted in a diagonal direction which is shifted from a center axis A3 of the pixel P1L.

The convex surface described above of the second lens 25R is the same. However, the second lens 25R is arranged in a state where the shape of the second lens 25L is inverted from right to left. In the second lens 25R, a spherical surface Sr is also included in a portion which faces the pixel P2 and the inclined surface St is included in a portion which faces the pixel P1R. In addition, the inclined surface St is gently inclined as a roof on one half side, for example, from a vicinity of a boundary between the pixel P1R and the pixel P2 toward the end section e of the pixel P1R. Due to this, on the pixel P2, an optical axis of the second lens 25R (which is not shown in the diagram) is formed to substantially match or be slightly shifted from the center axis of the pixel P2. However, incident light in this portion is mostly incident on the photodiode inside the pixel P2. On the other hand, on the pixel P1R, as shown in FIG. 5B, the optical axis Z1 extends inside the pixel P2. Due to this, in the second lens 25R, light which is incident on the inclined surface St is easily refracted in a diagonal direction which is shifted from the center axis A3 of the pixel P1R.

Although details will be described below, due to each of the lens shapes of the second lenses 25L and 25R, light is received while securing the left and right separation ratio in the pixels P1L and P1R. In addition, a part of the light which is refracted by the inclined surface St is incident on the pixel P2.

Manufacturing Method

FIG. 6 to FIG. 11 represent cross-sectional configurations for illustrating a method for manufacturing the solid-state imaging element 1 shown in FIG. 1. Here, only a portion which corresponds to the pixels P1L and P2 and the pixel P3 is illustrated in FIG. 6 to FIG. 11. It is possible to manufacture the solid-state imaging element 1, for example, as follows.

That is, firstly, the pixel P is formed. In detail, a photodiode PD is formed by being embedded inside the semiconductor layer 10 formed of, for example, a silicon substrate and the like and a pixel circuit which includes a pixel transistor and the like and a peripheral circuit 130 are formed on a front surface (the circuit forming surface S1). Subsequently, the substrate 130 is bonded on the circuit forming surface S1 after forming the multilayer wiring layer 120. After that, the semiconductor layer 10 is polished and the light incident surface S2 of the semiconductor layer 10 is exposed. The light shielding layer 21, the planarizing layer 22, and the color filter layer 23 are formed in sequence on the light incident surface S2.

After that, the first lens 24 is formed on the pixel P3, the second lens 25L is formed on the pixels P1L and P2, and the second lens 25R is formed on the pixels P1R and P2. However, since the forming process of the second lens 25R is the same as the second lens 25L, the forming process is omitted from the diagram.

Figure 6:
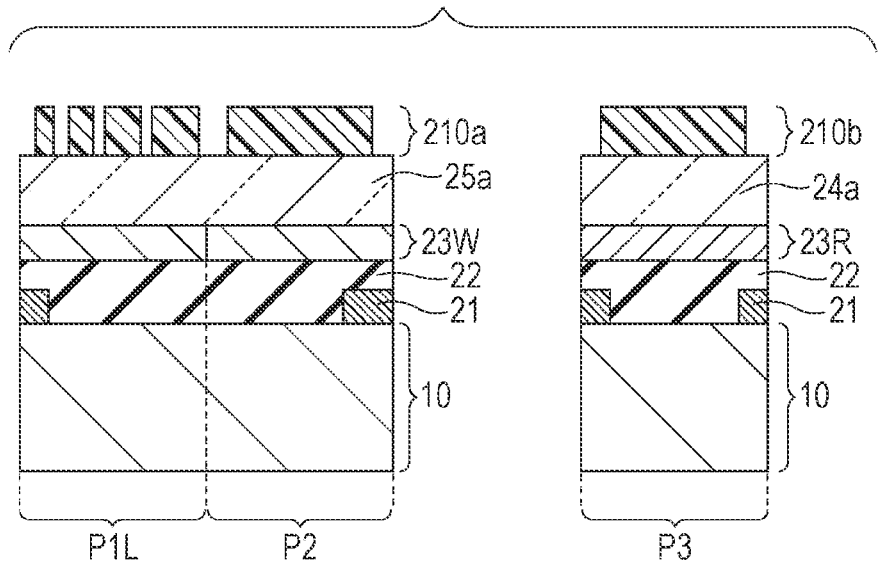
FIG. 6 is a cross-sectional diagram for illustrating a method for manufacturing the solid-state imaging element shown in FIG. 1.
Figure 7:
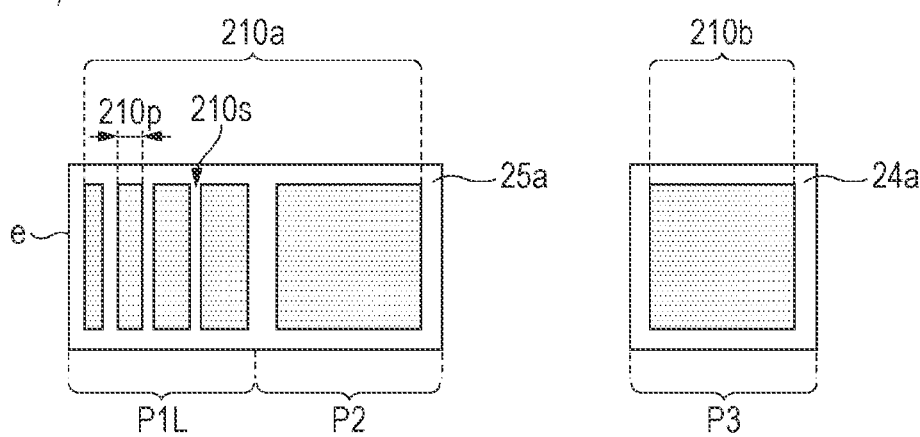
FIG. 7 is a schematic diagram for illustrating a pattern of a photoresist shown in FIG. 6.

In detail, firstly, as shown in FIG. 6, after forming a transparent resin 25a on the pixels P1L and P2, a photoresist 210a is formed on the transparent resin 25a in a predetermined pattern (a slit pattern). For example, as shown in FIG. 7, the photoresist 210a does not have a slit 210s (or the slit 210s is small) in a portion which faces the pixel P2 and has a pattern in a substantially square island shape. On the other hand, the photoresist 210a is finely divided by the slit 210s in a portion which faces the pixel P1L. In addition, an arrangement interval 210p of the slit 210s is gradually (in stages) narrowed closer to the end section e of the pixel P1L. Here, in the example in FIG. 7, the width of the slit 210s is constant; however, the width may be changed in stages.

On the other hand, after forming a transparent resin 24a on the pixel P3, a photoresist 210b is formed on the transparent resin 24a in a predetermined pattern. For example, as shown in FIG. 7, the photoresist 210b has a pattern in a substantially square island shape.

Figure 8:
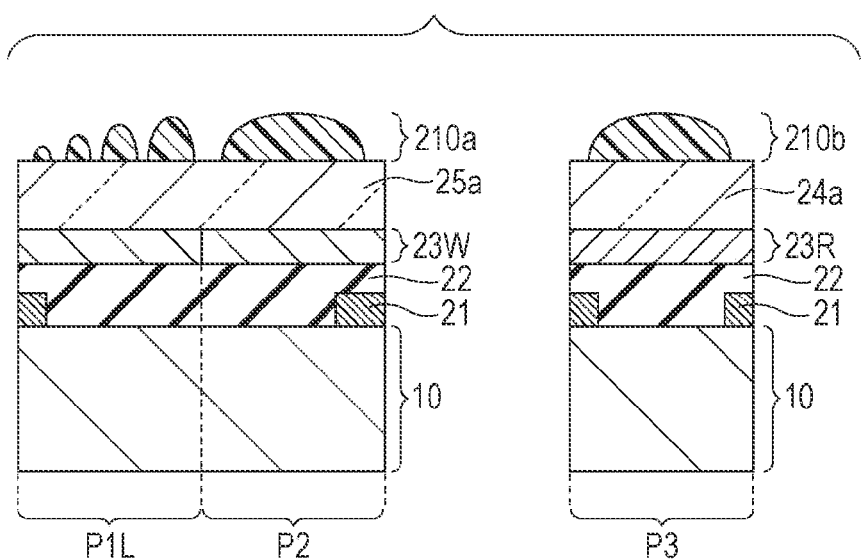
FIG. 8 is a cross-sectional diagram for illustrating a process which continues from FIG. 7.

Subsequently, as shown in FIG. 8, corners of the photoresists 210a and 210b are taken off to form a rounded shape by performing a heat annealing treatment (reflowing).

Figure 9:
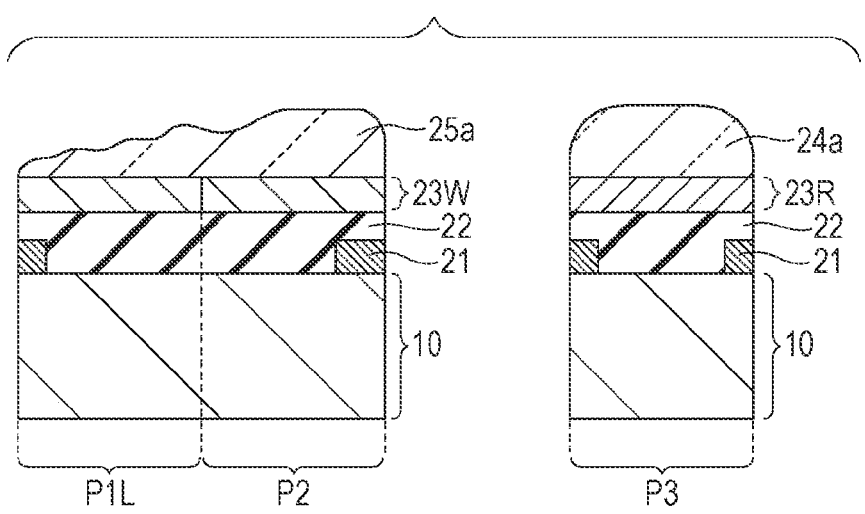
FIG. 9 is a cross-sectional diagram for illustrating a process which continues from FIG. 8.

After that, as shown in FIG. 9, the photoresists 210a and 210b are separated, for example, after performing dry etching. Due to this, a lens layer 25a which has unevenness on the front surface is formed in the pixels P1L and P2. On the other hand, a lens layer 24a with a shape which is substantially close to the shape of the first lens 24 is formed in the pixel P3.

Figure 10:
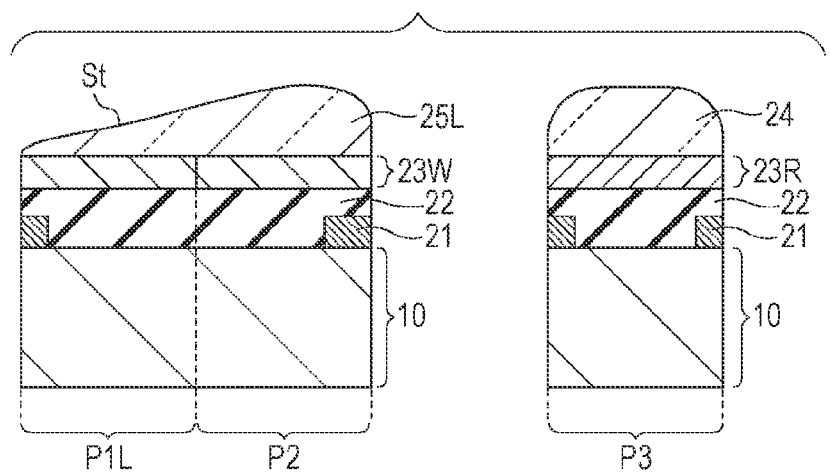
FIG. 10 is a cross-sectional diagram for illustrating a process which continues from FIG. 9.

Lastly, as shown in FIG. 10, the front surfaces of the lens layers 24a and 25a described above are made gentle by performing a heat annealing treatment. Due to this, the second lens 25L which has the inclined surface St is formed on the pixels P1L and P2 and the first lens 24 is formed on the pixel P3. Here, by appropriately setting a pattern of the photoresist 210a described above, various conditions of the heat annealing, and the like, it is possible to form the inclined surface St of the second lens 25L in a desired shape (it is possible to form the optical axis in a desired direction).

Figure 11:
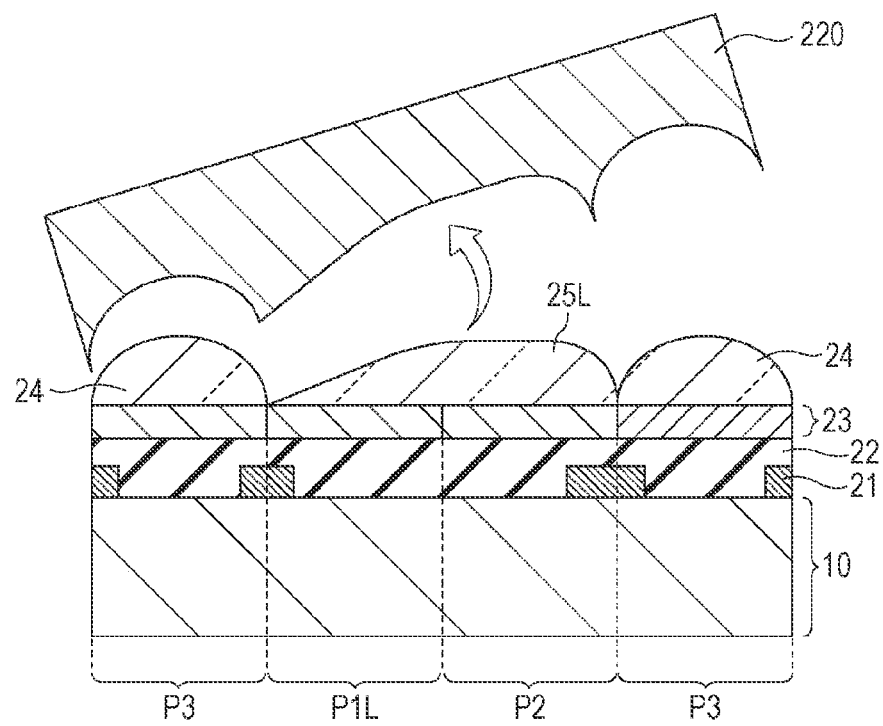
FIG. 11 is a cross-sectional diagram for illustrating another method for manufacturing the solid-state imaging element shown in FIG. 1.

Here, examples of a method for forming the first lens 24 and the second lenses 25L and 25R also include a forming method employing press molding using a metal mold 220 as shown in FIG. 11 other than the reflowing described above. In this manner, it is also possible to form the first lens 24 and the second lenses 25L and 25R using the metal mold 220 where a pattern of each surface shape of the first lens 24 and the second lenses 25L and 25R is formed in advance.

Operation and Effects

In the solid-state imaging element 1 of the present embodiment, the incident light is photoelectrically converted in the photodiodes PD in each pixel P and generates electrons and positive holes. For example, the electrons out of these are accumulated in the photodiodes PD as a signal charge. In the photodiodes PD, the signal charges which are generated and accumulated are read out in a vertical signal line Lsig (FIG. 29 described below) as a voltage signal after being transferred to a pixel circuit via an FD at a predetermined timing.

Here, in the solid-state imaging element 1, the pixels P1L and P1R for detecting a phase difference are provided in a selective region out of a plurality of pixels P. A phase difference is detected by a calculation process based on signals which are read out from each of the pair of the pixels P1L and P1R. It is possible to realize an AF function by performing focus determination by comparing the detected phase difference and the phase difference during the focusing.

On the other hand, the signals which are read out from the pixels P2 and P3 are used for normal image generation (imaging). Here, it is possible to interpolate a portion which corresponds to the pixels P1L and P1R using the signals which are obtained from the pixels P2 and P3 in the periphery thereof.

Comparative Example

Figure 12A:
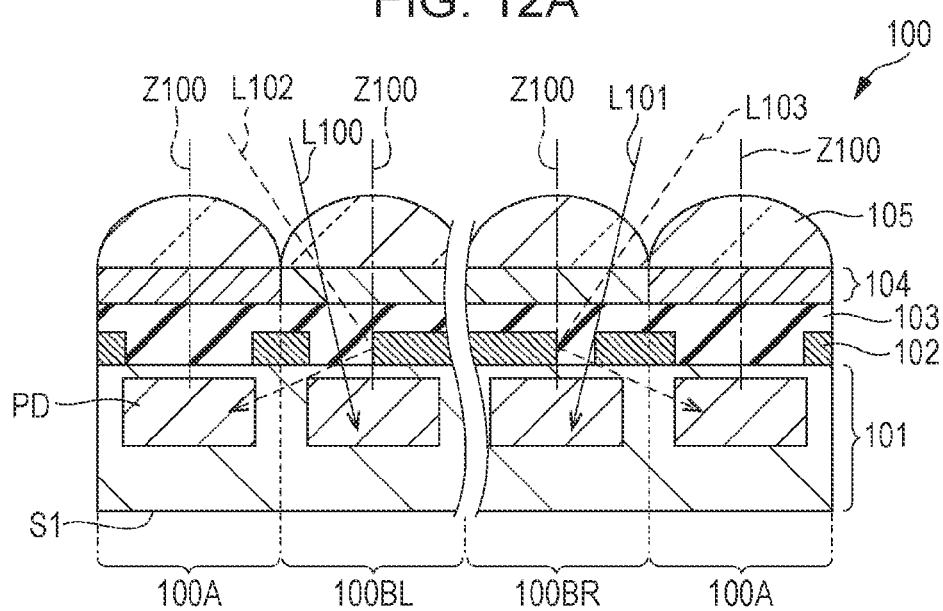
FIG. 12A is a cross-sectional schematic diagram for illustrating an operation of a solid-state imaging element according to a comparative example.

FIG. 12A shows a cross-sectional configuration of a solid-state imaging element (a solid-state imaging element 100) according to a comparative example of the present embodiment. Also in the comparative example, in the same manner as the present embodiment, pixels 100BL and 100BR for detecting a phase difference and a pixel 100A for generating an image are mixed and provided inside an imaging area. In addition, photodiodes PD for each pixel are formed inside a semiconductor layer 101 and a light shielding layer 102, a planarizing layer 103, a color filter layer 104, and an on-chip lens 105 are provided on the semiconductor layer 101. However, in the comparative example, the on-chip lens 105 is provided in a pixel unit and is formed such that an optical axis 2100 substantially matches the center axis of the pixel in all the pixels 100A, 100BL, and 100BR. In addition, in the pixels 100BL and 100BR for detecting a phase difference, the light shielding layer 102 is provided so as to shield light on half of the light receiving surface of the photodiode PD.

In the comparative example, phase difference detection is carried out using a signal based on light L100 which is incident on the pixel 100BL and a signal based on light L101 which is incident on the pixel 100BR. However, in the comparative example, since the light shielding area due to the light shielding layer 21 is large in the pixels 100BL and BR, the sensitivity (the amount of light received) is not sufficient. For example, since the light incident amount on the photodiode PD in the pixels 100BL and 100BR is not sufficient in a case of imaging in a dark place and the sensitivity which is necessary for detecting a phase difference is not obtained, and a phase difference is not detected as a result. In addition, it is desirable to increase the left and right separation ratio and to increase the light shielding area (to reduce the opening portion) in order to increase the precision of detecting a phase difference; however, the sensitivity further decreases in this case. That is, the phase difference detection precision and the sensitivity in the pixel for detecting a phase difference have an inversely proportional relationship.

In addition, when the pixel size is small, the sensitivity described above is easily further decreased. For example, when the pixel width is reduced following an increase in the number of pixels in the solid-state imaging element, the sensitivity in the pixels 100BL and 100BR is further decreased since the opening area in the light shielding layer 102 is even smaller.

Furthermore, in the comparative example, color mixing with the adjacent pixel 100A easily occurs due to the light L102 and L103 diffused in the end section of the light shielding layer 102. In particular, in an imaging apparatus which uses a single focal lens, color mixing easily occurs since light is more easily incident from a diagonal direction as the image height is higher.

Figure 12B:
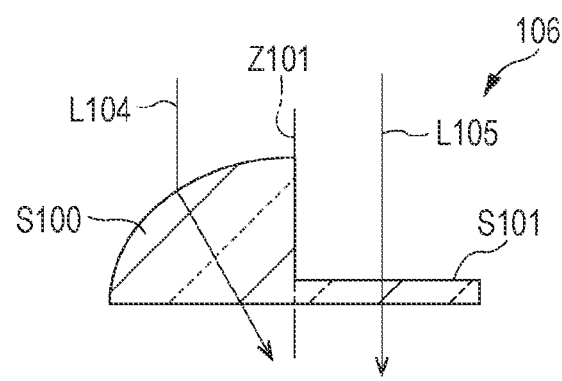
FIG. 12B is a cross-sectional schematic diagram which represents a shape of an on-chip lens according to another comparative example.

Here, in order to prevent such a decrease in the sensitivity and the like, it is possible to consider, for example, forming an on-chip lens 106 as shown in FIG. 12B on a phase difference detecting pixel. The on-chip lens 106 has a spherical surface S100 on one half side of an optical axis 2101 and has a flat surface S101 on the other half. However, although the decrease in the sensitivity is suppressed in a case of using the on-chip lens 106 with such a shape, the left and right separation ratio is not sufficient since the transmitted rays of light of the flat surface S101 are parallel light and the parallel light is also received. In addition, it is also difficult to manufacture a lens which has such a shape.

With respect to this, in the present embodiment, the optical axis Z1 of the second lenses 25L and 25R which are provided on the pixels P1L and P1R for detecting a phase difference out of a plurality of pixels P extends inside the adjacent pixel P2. In detail, there is an inclined surface St in a portion which faces the pixel P1L of the second lens 25L and there is an inclined surface St in a portion which faces the pixel P1R of the second lens 25R.

Figure 13A:
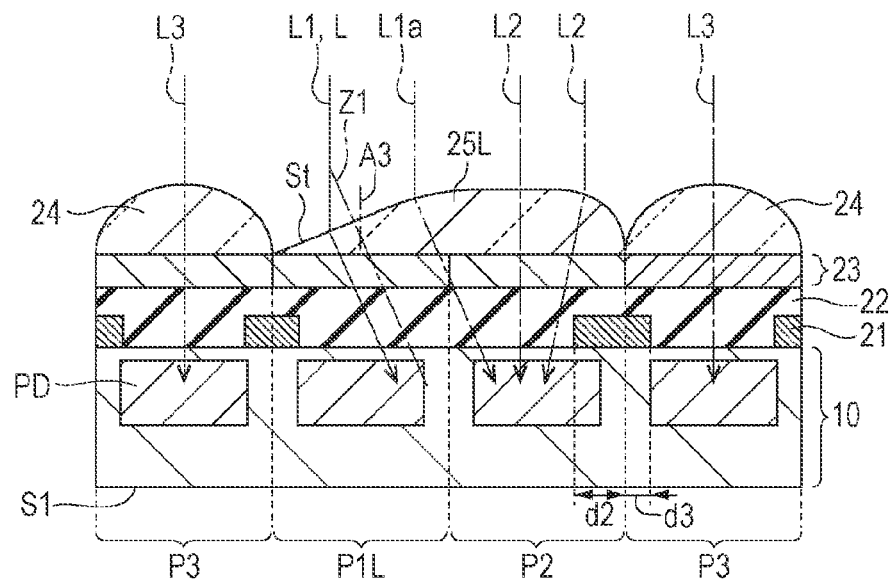
FIG. 13A is a cross-sectional diagram for illustrating an operation in the phase difference detecting pixel (L) and peripheral pixels thereof shown in FIG. 3A.
Figure 13B:
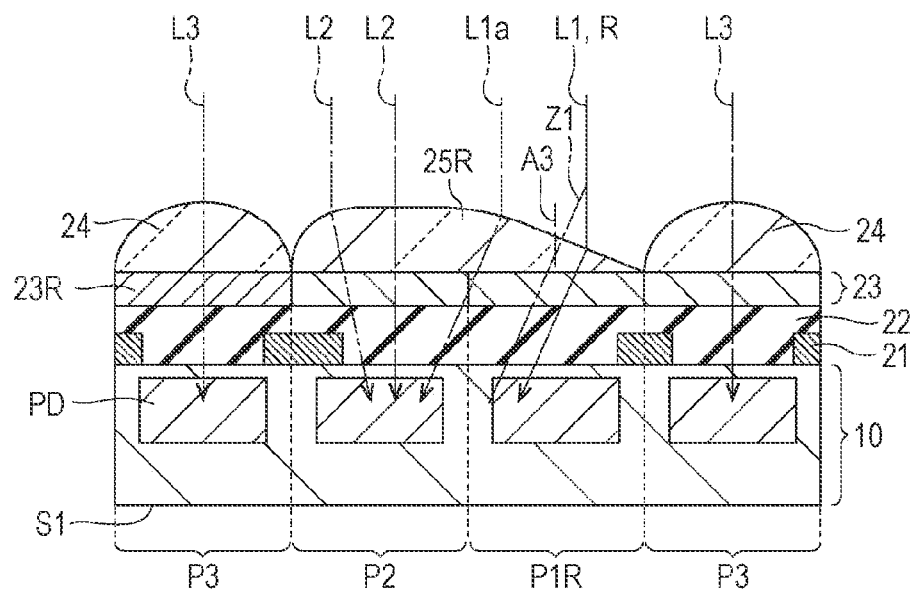
FIG. 13B is a cross-sectional diagram for illustrating an operation in the phase difference detecting pixel (R) and peripheral pixels thereof shown in FIG. 3B.

FIG. 13A shows a schematic diagram of an incident ray of light in the pixel P1L and the peripheral pixels thereof and FIG. 13B shows a schematic diagram of an incident ray of light in the pixel P1R and the peripheral pixels thereof. In the present embodiment, as shown in FIG. 13A, the light L1 (L) which is incident on the inclined surface St of the second lens 25L is refracted in a diagonal direction which is shifted from the center axis A3 and is incident on the photodiode PD of the pixel P1L. In addition, as shown in FIG. 13B, the light L1 (R) which is incident on the inclined surface St of the second lens 25R is refracted in a diagonal direction which is shifted from the center axis A3 and is incident on the photodiode PD of the pixel P1L. Accordingly, it is possible to detect a phase difference using a signal based on the light L1 (L) which is obtained from the pixel P1L and a signal based on the light L1 (R) which is obtained from the pixel P1R.

In this manner, in the present embodiment, it is possible to detect a phase difference by securing the left and right separation ratio without increasing the light shielding area. Thus, sufficient sensitivity is easily obtained. In addition, due to the light shielding area according to the light shielding layer 21 decreasing, the generation of color mixing due to the diffusion as in the comparative example described above is also suppressed.

In addition, since the regions between the pixel P1L and the pixel P2 and between the pixel P1R and the pixel P2 are not shielded by the light shielding layer 21, the generation of color mixing due to the diffusion as in the comparative example described above is suppressed.

On the other hand, light L1a which is a part of the light which is refracted in the inclined surface St is incident on the pixel P2. In the present embodiment, due to color filters with identical colors (color filters 23W) being provided between the pixel P1L (P1R) and the pixel P2, color mixing does not occur even when the light L1a is incident on the adjacent pixel P2.

In addition, due to this, the light L2 which passes through a portion which faces the pixel P2 in the second lens 25L (25R) and the light L1a described above are incident on the photodiode PD of the pixel P2. For this reason, the sensitivity easily increases (the amount of light received increases) in the pixel P2 compared to the other pixel P3 for generating an image. By setting the width d2 in the pixel P2 of the light shielding layer 21 to be larger than the width d3 in the pixel P3 as in the present embodiment, it is possible to make the sensitivities of the pixels P2 and P3 substantially the same (equalized).

Here, the sensitivities of the pixels P2 and P3 are equalized using the light shielding layer 21 in the present embodiment; however, for example, gain correction may be performed in order to decrease the sensitivity of the pixel P2. In this case, the widths d2 and d3 of the light shielding layer 21 may be set to be the same size as each other.

As described above, in the present embodiment, the optical axis Z1 of the second lenses 25L and 25R which are provided on the pixels P1L and P1R for detecting a phase difference out of a plurality of pixels P extends inside the pixels P2 which are adjacent thereto. That is, the second lenses 25L and 25R have a predetermined inclined surface St. Due to this, it is possible to refract the light which is incident on the inclined surface St of the second lenses 25L and 25R in a diagonal direction which is shifted from a pixel center axis to be incident on the pixels P1L and P1R. Accordingly, it is possible to secure the left and right separation ratio without limiting the opening area due to the light shielding layer 21. Thus, it is possible to detect a phase difference while suppressing a decrease in sensitivity. In addition, it is also possible to improve both of the phase difference detection function and the sensitivity.

In addition, it is also possible to suppress the generation of color mixing which is caused by the diffusion in the light shielding layer 21. Due to this, there is also an advantage that, for example, the imaging quality improves.

Below, description will be given of another embodiment of the solid-state imaging element of the first embodiment described above. Here, the same reference numerals are used for the same constituent elements as the solid-state imaging element of the first embodiment described above and description thereof will be appropriately omitted.

Second Embodiment

Figure 14:
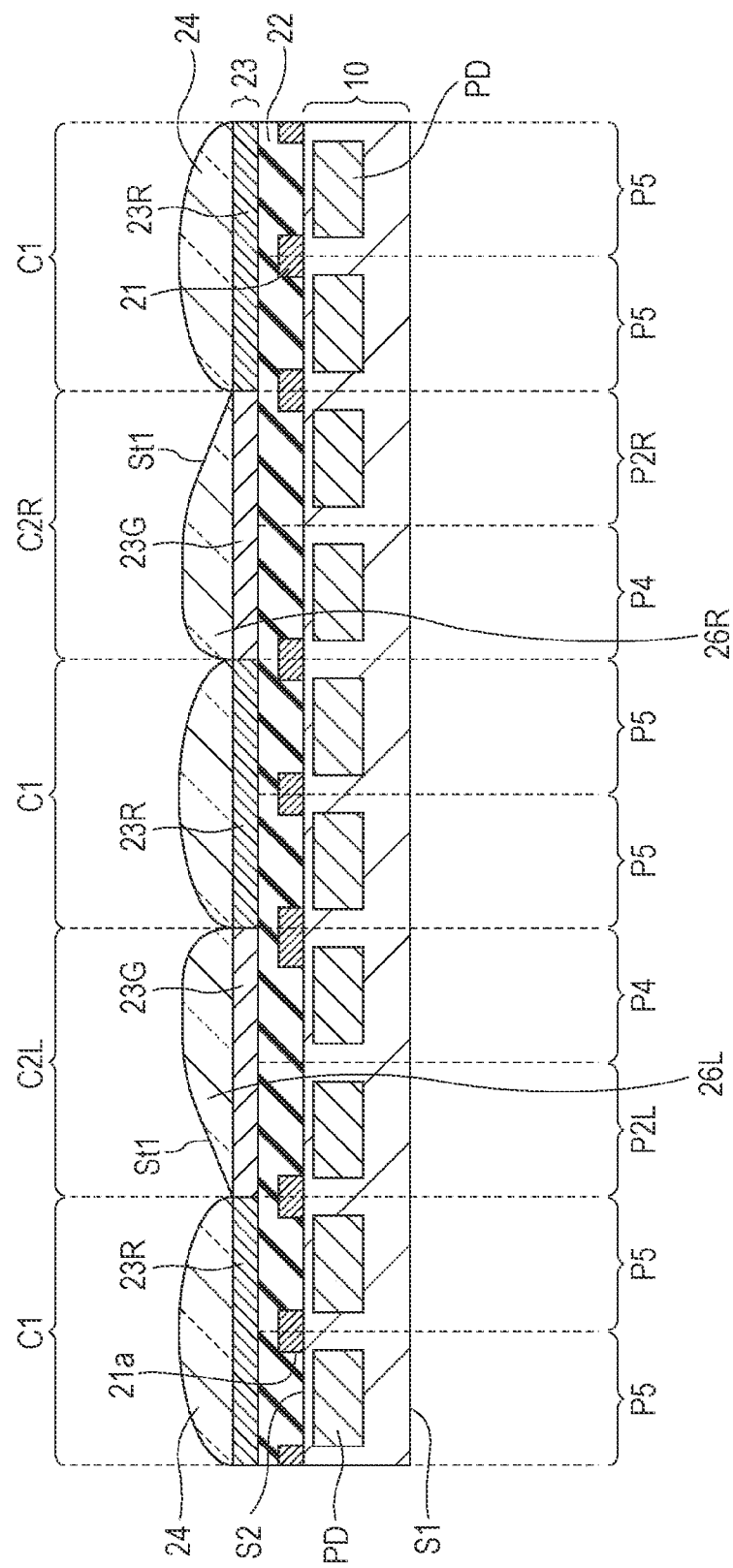
FIG. 14 is a cross-sectional diagram which represents a main configuration of a solid-state imaging element according to a second embodiment of the present disclosure.
Figure 15:
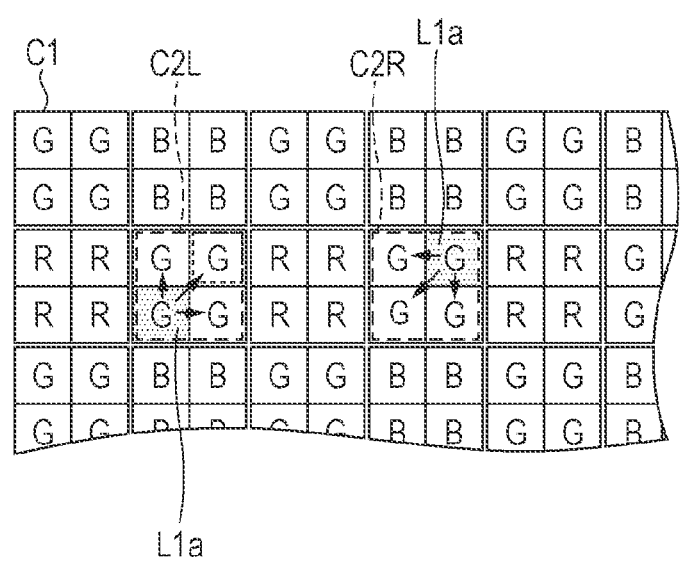

FIG. 14 is a cross-sectional diagram which represents a main configuration of a solid-state imaging element according to the second embodiment. FIG. 15 represents one example of a pixel array of the solid-state imaging element of the present embodiment. Also in the solid-state imaging element of the present embodiment, in the same manner as the solid-state imaging element 1 of the first embodiment described above, pixels for detecting a phase difference (P2L and P2R) and pixels for generating an image (P4 and P5) are mixed and provided as a plurality of pixels P. However, in the present embodiment, the first lens 24 and second lenses 26L and 26R are provided in pixel groups (C1, C2L, and C2R) units formed of four pixels P. In addition, the pixels have a structure where it is possible to read out signal charges in two or more pixel units inside the pixel groups C1, C2L, and C2R.

In the same manner as the pixels P1L and P1R of the first embodiment described above, the pixels P2L and P2R are used as a pair, for example, when detecting a phase difference and, for example, are arranged at predetermined intervals as shown in FIG. 15. A phase difference is calculated based on signals which are obtained each of the pixels P2L and P2R and it is possible to realize an AF function by performing focus determination based on the calculated phase difference. For example, color filters with identical colors to each other are provided in the pixels P2L and P2R. For example, here, G pixels are used as the pixels P2L and P2R and the color filter 23G is provided in both of the pixels P2L and P2R.

The pixels P4 and P5 are pixels for generating an image. The pixel P4 out of these is a pixel which is adjacent to the pixel P2L or the pixel P2R for detecting a phase difference described above. In detail, the pixel P4 is provided to be adjacent each to three places of above, above right, and right in relation to the pixel P2L and to three places of left, below left, and below in relation to the pixel P2R. The pixel P5 is provided in a region other than these pixels P2L, P2R, and P4.

In the same manner as the pixels P of the first embodiment described above, each of these pixels P2L, P2R, P4, and P5 has a photodiode PD which is formed inside the semiconductor layer (or the semiconductor substrate) 10, for example, formed of silicon (Si). In addition, as schematically shown in FIG. 15, one pixel P is a pixel (an R pixel, a G pixel, a B pixel, or a W pixel) which acquires a signal based on any colored light of, for example, R (red), G (green), B (blue), or W (white).

A FD (floating diffusion) which is not shown in the diagram and a pixel circuit which includes a pixel transistor and the like are formed in the vicinity of the circuit forming surface S1 of the semiconductor layer 10; however, in the present embodiment, the FD and the pixel circuit are in common in two or more pixels P inside the pixel groups C1, C2L, and C2R. The light shielding layer 21 which has the opening section 21a is formed on the light incident surface S2 of the semiconductor layer 10 and the planarizing layer 22 is formed to cover the light shielding layer 21. The color filter layer 23 is provided on the planarizing layer 22 and the first lens 24 and the second lenses 26L and 26R are provided on the color filter layer 23.

In the same manner as the first embodiment described above, the light shielding layer 21 does not shield light in the regions between the pixel P2L and the pixel P4 and between the pixel P2R and the pixel P4 while shielding light in each of the regions between the pixel P2L (P2R) and the pixel P5, between the pixel P4 and the pixel P5, and between the pixels P5. In other words, while one opening section 21a is provided in the pixel P5 to oppose one photodiode PD, one opening section 21a is provided in the pixels P2L (P2R) and P4 to oppose four photodiodes PD.

The color filter layer 23 is formed by the color filters 23R, 23G, 23B, and 23W being regularly arranged; however, in the present embodiment, any of the color filters 23R, 23G, 23B, and 23W is provided in four pixel (the pixel groups C1, C2L, and C2R) units. Here, the color filter layer 23 may include other filters of, for example, cyan, magenta, or the like other than these.

In the present embodiment, one pixel P2L and three pixels P4 which are adjacent thereto are set as the pixel group C2L and one second lens 26L is provided on the pixel group C2L (over the pixel P2L and the three pixels P4). In the same manner, one pixel P2R and three pixels P4 which are adjacent thereto are set as the pixel group C2R and one second lens 26R is provided on the pixel group C2R (over the pixel P2R and the three pixels P4). In addition, four pixels P5 are set as the pixel group C1 and one first lens 24 is provided on the pixel group C1 (over the four pixels P5).

Figure 16A:
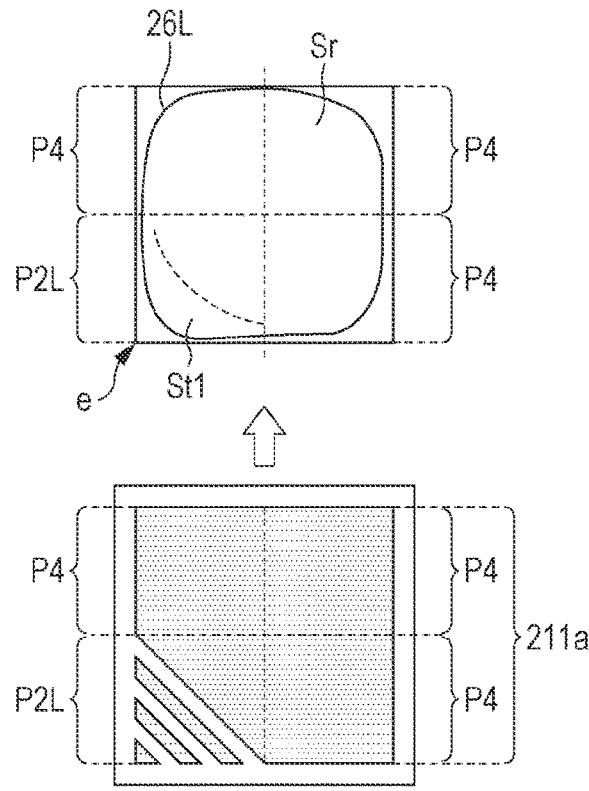
FIG. 16A is a schematic diagram which represents a shape of a second lens shown in FIG. 14 viewed from a light incident side and one example of a pattern of a photoresist for making such a shape.
Figure 16B:
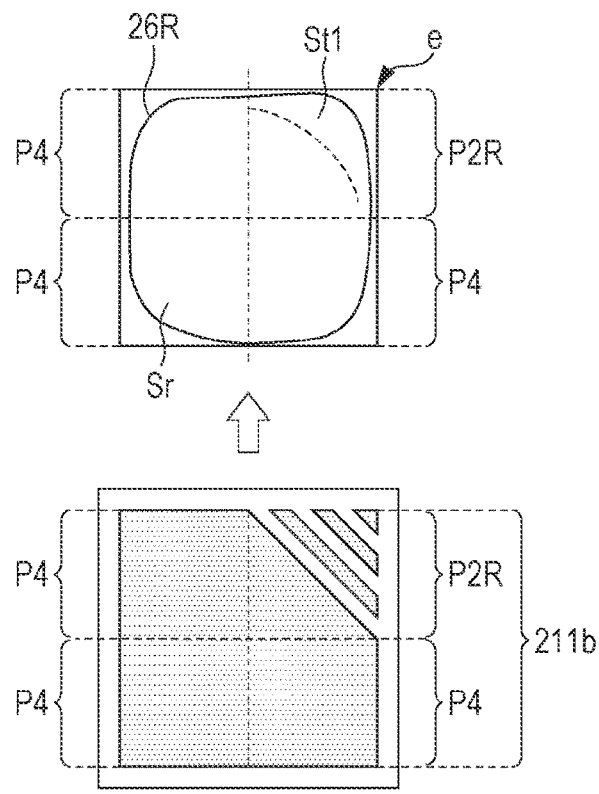
FIG. 16B is a schematic diagram which represents a shape of the second lens shown in FIG. 14 viewed from a light incident side and one example of a pattern of a photoresist for making such a shape.

FIG. 16A schematically shows the upper surface diagram of the second lens 26L and a pattern of a photoresist for making the shape. FIG. 16B schematically shows the upper surface diagram of the second lens 26R and a pattern of a photoresist for making the shape. Here, in each of the diagrams, a region which corresponds to each of the pixels P2L, P2R, and P4 in the second lenses 26L and 26R is shown with brackets.

The first lens 24 and the second lenses 26L and 26R are all so-called on-chip lenses and collect incident light toward the photodiode PD. The focal point and the optical axis of the first lens 24 and the second lenses 26L and 26R are set in appropriate positions according to the combination with other imaging lenses and the like inside the imaging apparatus, which are not shown in the diagram.

In the same manner as the second lenses 25L and 25R of the first embodiment described above, the second lenses 26L and 26R have a convex surface on a light incident side and the convex surface includes a predetermined inclined surface St1. That is, also in the second lenses 26L and 26R, the convex surface on the light incident side is not a completely spherical surface (or not designed to be a spherical surface) and has a shape which is partially inclined diagonally.

In detail, in the convex surface described above of the second lens 26L, a portion which faces the pixel P4 includes a spherical surface (a surface with a spherical shape) Sr in at least a part and a portion which faces the pixel P2L includes the inclined surface St1. The inclined surface St1 is gently inclined, for example, from the vicinity of a diagonal line of the pixel P2L toward an end section e of the pixel P2L. The inclined surface St1 may be a flat surface or may be a curved surface as long as the inclined surface St1 is a surface where, for example, approximately half or more of the incident light is refracted in a diagonal direction toward the pixel P4. In addition, the inclined surface St1 may have local unevenness (for example, unevenness and the like which are generated in a processing step).

Due to the shape of the second lens 26L, on the pixel P2L, the optical axis of the second lens 26L (the optical axis in a portion which faces the pixel P2L) extends inside any of the adjacent pixels P4. That is, in the second lens 26L, light which is incident on the inclined surface St is easily refracted in a diagonal direction which is shifted from the pixel center axis of the pixel P2L. In addition, as with the light L1a shown in FIG. 15, a part of the light which is refracted by the inclined surface St1 is incident on the three pixels P4.

The convex surface described above of the second lens 26R is the same. However, the second lens 26R is arranged in a state where the shape of the second lens 26L is inverted from right to left. Also in the second lens 26R, a spherical surface Sr is included in a portion which faces the pixel P4 and an inclined surface St1 is included in a portion which faces the pixel P2R. In addition, the inclined surface St1 is gently inclined, for example, from the vicinity of a diagonal line of the pixel P2R toward an end section e of the pixel P2R. Due to this, on the pixel P2, the optical axis of the second lens 26R extends inside any of the adjacent pixels P4. That is, in the second lens 26R, light which is incident on the inclined surface St1 is easily refracted in a diagonal direction which is shifted from the pixel center axis of the pixel P2R. In addition, as with the light L1a shown in FIG. 15, a part of the light which is refracted by the inclined surface St1 is incident on the three pixels P4.

When forming a lens shape of the second lenses 26L and 26R as described above, it is possible to use photoresists 211a and 211b where parts which oppose the pixels P2L and P2R are finely divided, for example, as shown in FIG. 16A and FIG. 16B.

Figure 17A:
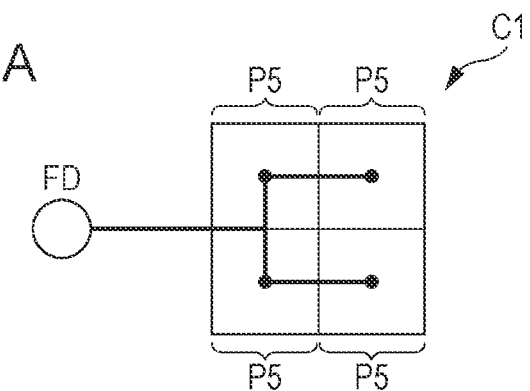
FIG. 17A is a schematic diagram for illustrating an electrical connection relationship of a first pixel group shown in FIG. 14.
Figure 17B:
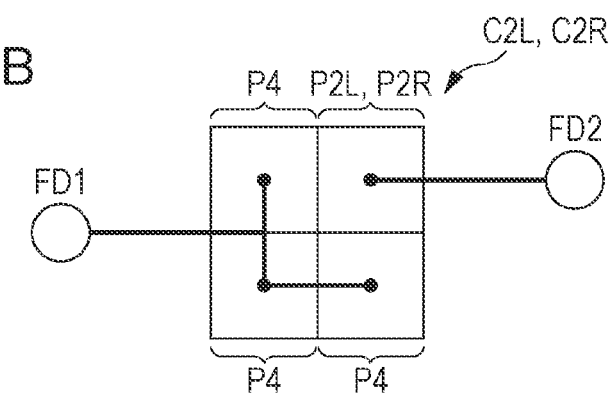
FIG. 17B is a schematic diagram for illustrating an electrical connection relationship of a second pixel group shown in FIG. 14.

FIG. 17A is a schematic diagram for illustrating an electrical connection relationship of the pixel P5 in the pixel group C1. FIG. 17B is a schematic diagram for illustrating an electrical connection relationship between the pixel P2L (P2R) and the pixel P4 in the pixel group C2L (C2R). As shown in FIG. 17A, in the pixel group C1, four pixels P5 are able to be electrically connected with one FD and when transferring charges, signal charges are read out from the four pixels P5 via one FD. On the other hand, as shown in FIG. 17B, in the pixel group C2L (C2R), the three pixels P4 are electrically connected with one FD1 and the pixel P2L (P2R) is able to be electrically connected with a separate FD2. When transferring charges, signal charges are read out from the three pixels P4 via the one FD1 and a signal charge is read out from the pixel P2L (P2R) via the FD2. In this manner, the pixels P2L and P2R for detecting a phase difference and the pixels P4 and P5 for generating an image are provided such that the electrical wirings for reading out the signals are independent from each other.

However, when generating an image, a saturated electrical charge amount and the sensitivity decrease in the pixel groups C2L and C2R compared to the pixel group C1. In detail, while four photodiodes PD are used for generating an image in the pixel group C1, the number of the pixels P (photodiodes PD) which are used for generating an image is three or less in the pixel groups C2L and C2R. For this reason, amplifying may be carried out by performing gain correction using, for example, an amplifier with respect to signals which are obtained from the three pixels P4 of the pixel groups C2L and C2R such that the saturated electrical charge amount and the sensitivity are equal to the signals which are obtained from the four pixels P5 of the pixel group C1.

Figure 18:
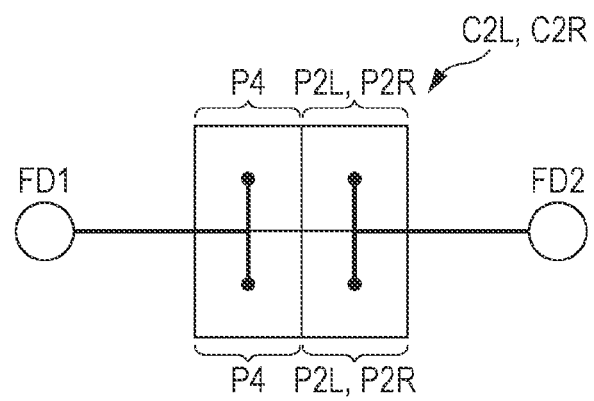
FIG. 18 is a schematic diagram for illustrating another configuration and an electrical connection relationship of the second pixel group shown in FIG. 17B.

Here, as shown in FIG. 18, the pixel group C2L (C2R) may be configured by two pixels P2L (P2R) and two pixels P4. In this case, it is sufficient if one FD2 is provided in the two pixels P2L (P2R) and one FD1 is provided in the two pixels P4. In addition, it is sufficient that the shape of the second lenses 26L and 26R has an inclined surface in on one half side. Alternatively, the pixel group C2L (C2R) may be configured by three pixels P2L (P2R) and one pixel P4. In addition, it is sufficient if the number of the pixels which share one FD is two or more and may be, for example, six, or may be eight without being limited to two to four as described above.

As in the present embodiment, the first lens 24 and the second lenses 26L and 26R may be provided in pixel groups C1, C2L, and C2R in units and a common FD may be provided in two or more pixels P. Also, in the present embodiment, by the second lenses 26L and 26R having a predetermined shape as described above, it is possible to secure the left and right separation ratio without limiting the opening area due to the light shielding layer 21. Thus, it is possible to obtain an effect equal to the first embodiment described above.

Third Embodiment

Figure 19A:
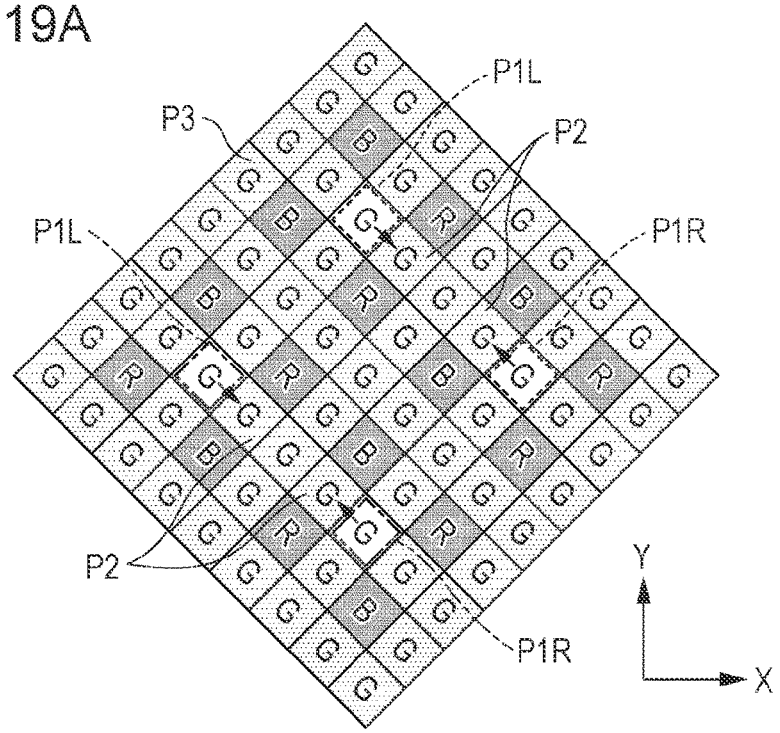
FIG. 19A is a planar schematic diagram which represents a pixel array of a solid-state imaging element according to a third embodiment of the present disclosure.

FIG. 19A is a planar schematic diagram which represents a pixel array of a solid-state imaging element according to the third embodiment of the present disclosure. In the first embodiment described above, a configuration where a plurality of pixels P are two-dimensionally arrayed along two directions of a horizontal direction and a vertical direction is given as an example; however, in the present embodiment, a plurality of pixels P are two-dimensionally arrayed along two directions which are respectively rotated by 45° from a horizontal direction X and a vertical direction Y. In this manner, in a case in which a plurality of pixels P are arrayed along a diagonal direction (referred to below as a diagonal array), in the same manner as the first embodiment described above, pixels P1L and P1R for detecting a phase difference and pixels P2 and P3 for generating an image are mixed and arranged.

In the diagonal array described above, for example, all of the color filters 23R, 23G, and 23B are provided in a pixel unit and G pixels (the color filter 23G) are arranged so as to surround each of the R pixels (the color filter 23R) and B pixels (the color filter 23B). Out of these, a pair of pixels which have color filters with identical colors are used for detecting a phase difference. In this example, since a relatively large number of G pixels are arranged, some of the G pixels are used as the pixels P1L and P1R for detecting a phase difference. The pixel P2 is arranged to be adjacent to each of the pixels P1L and P1R and the pixel P3 is arranged in another region.

Figure 19B:
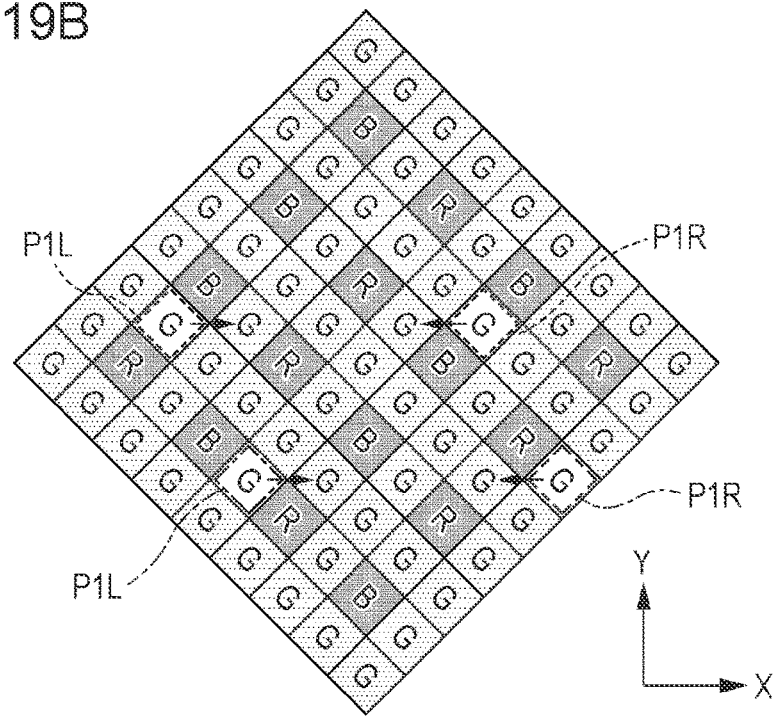
FIG. 19B is a planar schematic diagram which represents another example of a pixel array of the solid-state imaging element according to the third embodiment of the present disclosure.

As the present embodiment, by also forming the second lenses 25L and 25R as described above on the pixels P1L and P1R in a case in which a plurality of pixels P have a diagonal array, it is possible to obtain an effect equal to the first embodiment described above. In addition, the pixels P1L and P1R for detecting a phase difference may be arranged as shown in FIG. 19B.

Fourth Embodiment

Figure 20:
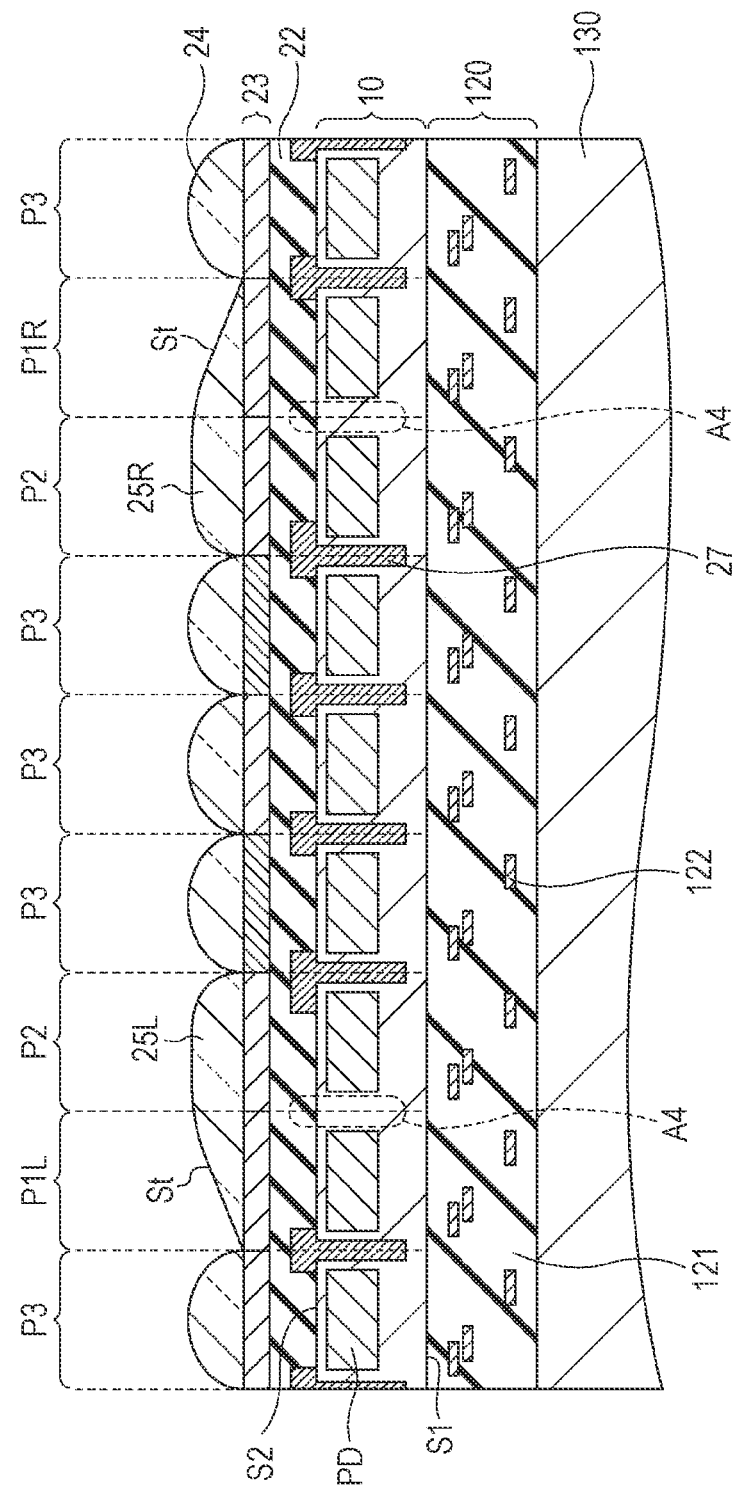
FIG. 20 is a cross-sectional diagram which represents a configuration of a solid-state imaging element according to a fourth embodiment of the present disclosure.

FIG. 20 is a cross-sectional diagram which represents a configuration of a solid-state imaging element according to the fourth embodiment of the present disclosure. In the solid-state imaging element of the present embodiment, the configuration of a light shielding layer is different from the solid-state imaging element 1 of the first embodiment described above and the configuration is the same in other respects. A light shielding layer 27 of the present embodiment (a second light shielding layer) has an opening section 27a in the same manner as the light shielding layer 21 of the first embodiment described above; however, unlike the light shielding layer 21, the light shielding layer 27 is provided to also extend in a region between pixels P (between the photodiodes PD). In detail, the light shielding layer 27 has a portion which is embedded in a groove which is cut in the depth direction of the semiconductor layer 10.

In the same manner as the light shielding layer 21 of the first embodiment described above, the light shielding layer 27 does not shield light in the region (a portion A4 which is surrounded by a dashed line) between the pixel P1L and the pixel P2 and between the pixel P1R and the pixel P2 while shielding light in each of the regions between the pixel P1L (P1R) and the pixel P3, between the pixel P2 and the pixel P3, and between the pixels P3. Due to this, it is possible to suppress color mixing due to light shielding between the pixel P1L (P1R) and the pixel P3, between the pixel P2 and the pixel P3, and between the pixels P3. On the other hand, in the regions A4 of between the pixel P1L and the pixel P2 and between the pixel P1R and the pixel P2, color mixing as described in the first embodiment described above does not easily occur even when the light is not shielded.

Fifth Embodiment

Figure 21A:
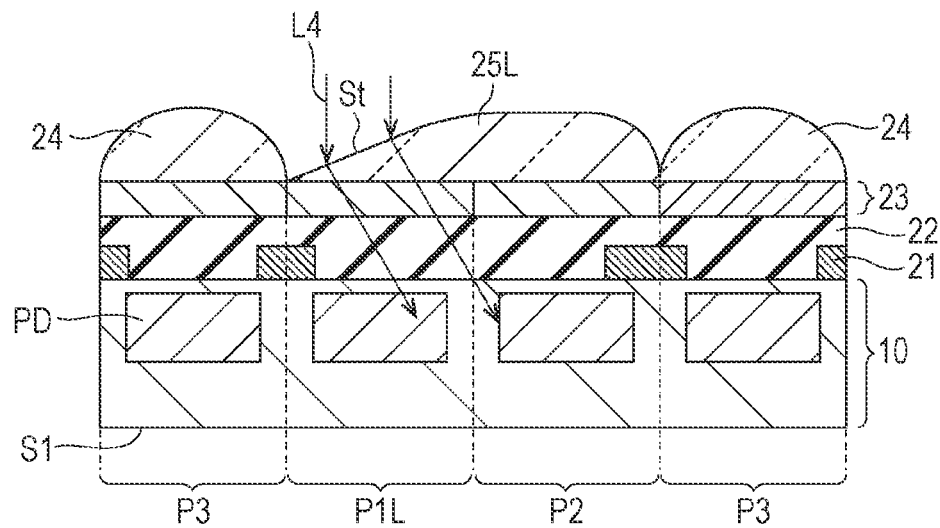
FIG. 21A is a cross-sectional diagram which represents a part of a configuration of a solid-state imaging element according to a fifth embodiment of the present disclosure.
Figure 21B:
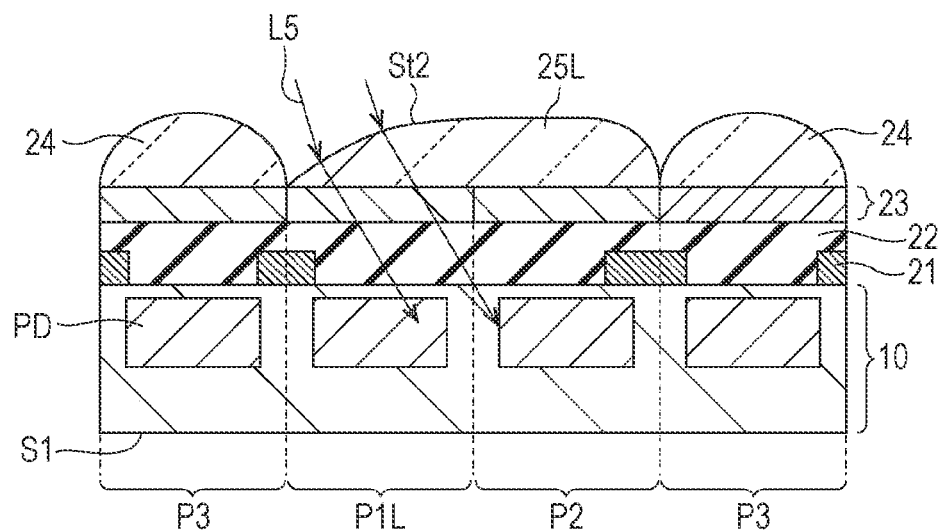
FIG. 21B is a cross-sectional diagram which represents a part of a configuration of the solid-state imaging element according to the fifth embodiment of the present disclosure.
Figure 22A:
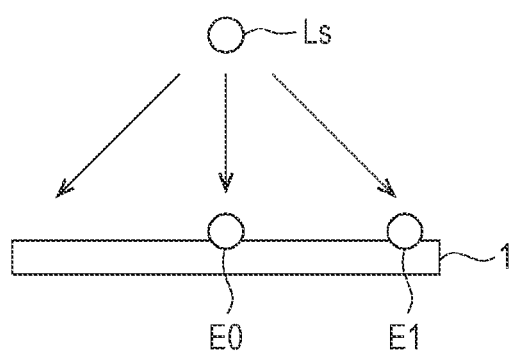
FIG. 22A is a schematic diagram for illustrating each of the configurations shown in FIG. 21A and FIG. 21B.
Figure 22B:
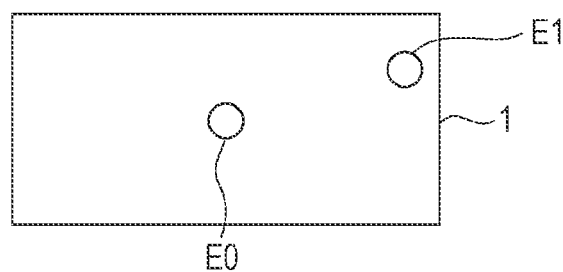
FIG. 22B is a schematic diagram for illustrating each of the configurations shown in FIG. 21A and FIG. 21B.

FIG. 21A and FIG. 21B represent a part of a configuration of a solid-state imaging element according to the fifth embodiment of the present disclosure. The solid-state imaging element described in the embodiments and the like described above receives light, for example, from a positional light source via an imaging lens inside an electronic device or an imaging apparatus. For this reason, as shown in FIG. 22A and FIG. 22B, light L4 which is incident on a region with a low image height (a central position E0 of the imaging area) and light L5 which is incident on a region with a high image height (a position E1 of a peripheral section (an end section) of the imaging area) have different incidence angles from each other.

In the present embodiment, the image height described above is taken into consideration and the shapes (the focal points or the optical axes) of the second lenses 25L and 25R are different according to the pixel position. In detail, the second lens 25L at the position E0 has the inclined surface St (FIG. 21A) in a portion which faces the pixel P1L and the second lens 25L at the position E1 has an inclined surface St2 (FIG. 21B) in a portion which faces the pixel P1L. The position of the focal point of the inclined surface St and the position of the focal point of the inclined surface St2 are different.

In this manner, particularly in a case of using a positional light source Ls, in the pixels P1L and P1R, the shapes of the second lenses 25L and 25R may be formed so as to be different according to the pixel positions. Also in the present embodiment, it is possible to obtain an effect equal to the first embodiment described above and it is possible to obtain a so-called pupil correction effect. In addition, without being limited to the pixels P1L and P1R, the optical axis of the first lens 24 in the pixel P3 may also be shifted according to the pixel position.

In addition, the width of the light shielding layer 21 may be set to be different between the position E0 and the position E1. For example, there may be a design where the width d2 out of the widths d1, d2, and d3 is larger than the width d3 in the examples shown in FIG. 3A and FIG. 3B; however, the size relationship may be set to be close to equal (d1=d2=d3) from the position E0 toward the position E1. This is because it is possible to obtain a so-called pupil correction effect.

Sixth Embodiment

Figure 24:
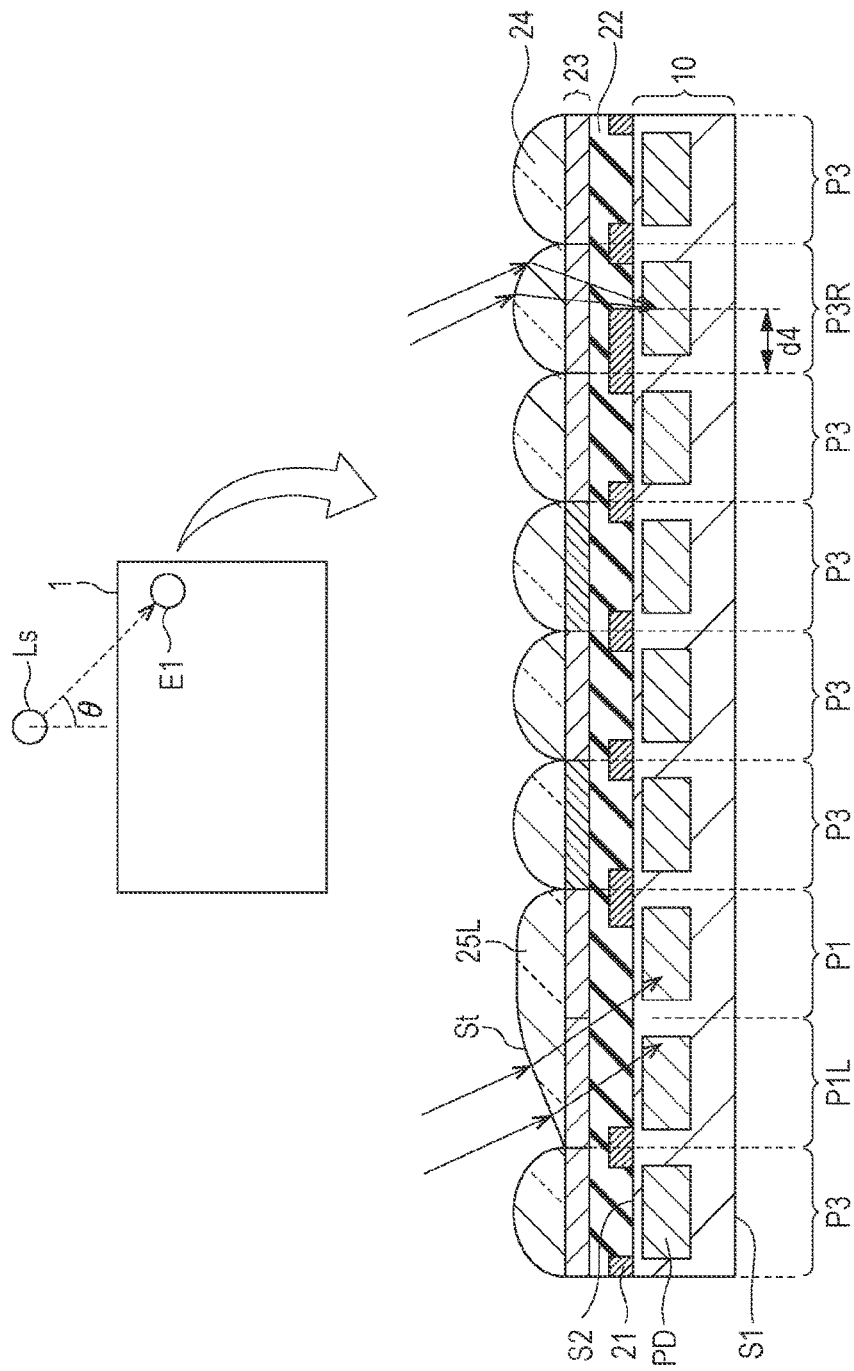
FIG. 24 is a schematic diagram which represents a part of a configuration of the solid-state imaging element according to the sixth embodiment of the present disclosure.
Figure 25:
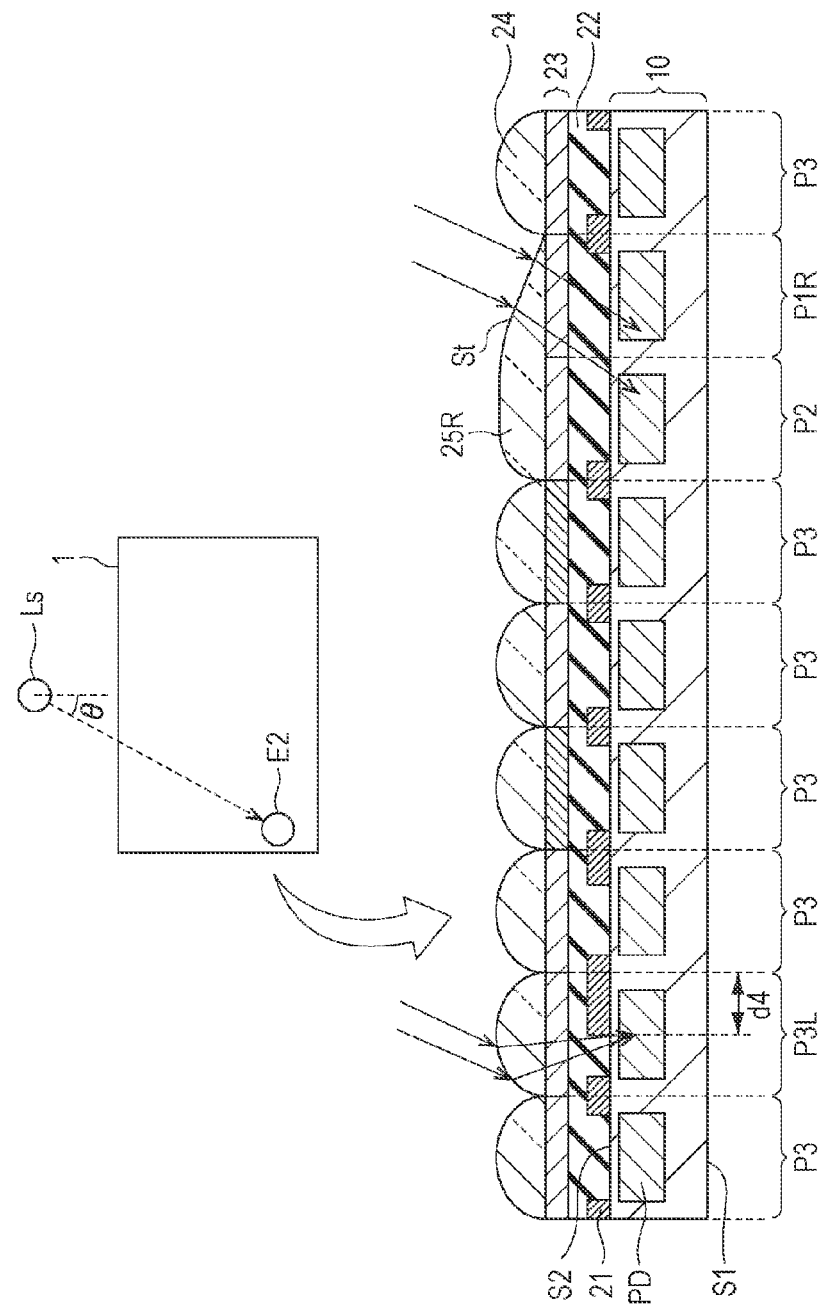
FIG. 25 is a schematic diagram which represents a part of a configuration of the solid-state imaging element according to the sixth embodiment of the present disclosure.

FIG. 23 to FIG. 25 represent a part of a configuration of a solid-state imaging element according to the sixth embodiment of the present disclosure. In the first embodiment and the like described above, description is given of a case in which the second lenses 25L and 25R which have a predetermined inclined surface St are provided in each of a pair of the pixels P1L and P1R which are used for detecting a phase difference. In the present embodiment, unlike the first embodiment described above, the image height as described above is taken into consideration and the combination of the pixel structures which are used for detecting a phase difference is different according to the pixel position.

In detail, as shown in FIG. 23, at the central position E0 of the imaging area, in the same manner as the case described in the first embodiment described above, the second lenses 25L and 25R are provided in both of the pixels P1L and P1R for detecting a phase difference. Due to this, as described in the first embodiment described above, in any of the pixels P1L and P1R, a ray of light in a portion which is shifted from the pixel center axis due to the shape of the second lenses 25L and 25R is received and a signal which is necessary for detecting a phase difference is obtained.

On the other hand, in the peripheral sections with a high image height (positions E1 and E2), one of the pair of the pixels which are used for detecting a phase difference does not have a lens shape and a signal which is necessary for detecting a phase difference is obtained due to the pixel structure which uses the light shielding layer 21. For example, as shown in FIG. 24, at the position E1 where the incident optical axis from the positional light source Ls makes an angle θ from the vertical direction, the second lens 25L is provided on the pixel P1L and a desired signal is obtained using the inclined surface St. However, in the other pixel for detecting a phase difference (set as a pixel P3R), assuming that the second lens 25R shown in FIG. 23 is used, it is difficult to obtain a sufficient light amount due to the influence of the image height. For this reason, the first lens 24 which is the same as for the other pixels P3 is provided in the pixel P3R at the position E1. However, in order to get a phase difference, the width d4 of the light shielding layer 21 is set to a size which substantially covers half of the light receiving surface in the pixel P3R.

On the other hand, as shown in FIG. 25, at the position E2 (an end section which is an opposite side to the position E1) where the incident optical axis from the positional light source Ls makes an angle θ from the vertical direction, the second lens 25R is provided on the pixel P1R and a desired signal is obtained using the inclined surface St. However, in the other pixel for detecting a phase difference (set as a pixel P3L), assuming that the second lens 25L shown in FIG. 23 is used, it is difficult to obtain a sufficient light amount due to the influence of the image height. For this reason, the first lens 24 which is the same as for the other pixels P3 is provided in the pixel P3L at the position E2. However, in order to get a phase difference, the width d4 of the light shielding layer 21 is set to a size which substantially covers half of the light receiving surface in the pixel P3L.

As in the present embodiment, the pixel structures which are used for detecting a phase difference may be appropriately combined according to the image height (the pixel position). Due to this, it is possible to obtain an effect equal to the first embodiment described above and it is possible to suppress a decrease in the sensitivity while performing pupil correction in the pixel for detecting a phase difference.

Seventh Embodiment

Figure 26:
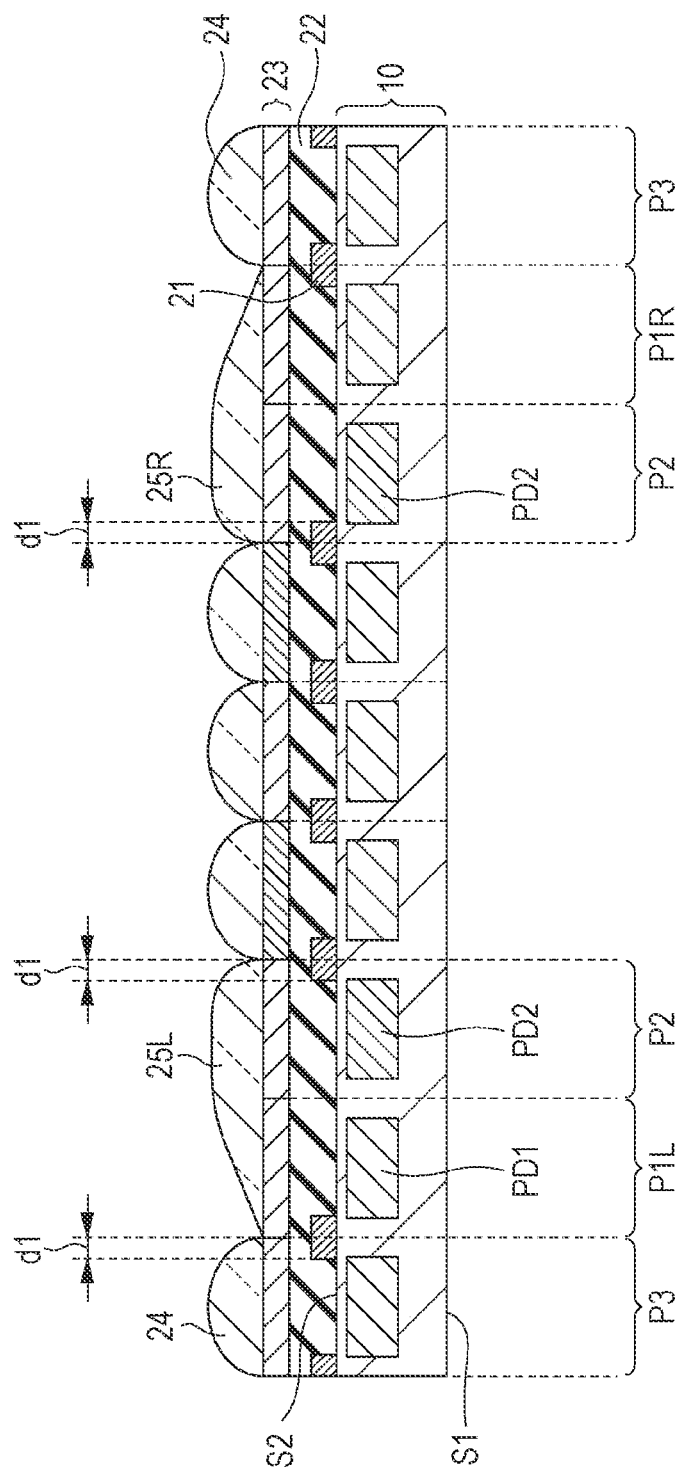
FIG. 26 is a cross-sectional diagram which represents a main configuration of a solid-state imaging element according to a seventh embodiment of the present disclosure.

FIG. 26 represents a main configuration of a solid-state imaging element according to the seventh embodiment of the present disclosure. The first embodiment described above describes that, since the incident light on the pixel P2 increases due to the refraction on the inclined surfaces St of the second lenses 25L and 25R, the sensitivity is adjusted (equalized) by an opening limit or gain correction due to the light shielding layer 21. With respect to this, the solid-state imaging element of the present embodiment uses the sensitivity difference for each pixel P and has a dynamic range extension function.

In detail, since the sensitivity is low (the amount of light received is small) in the pixels P1L and P1R, a photodiode PD1 where the saturated electrical charge amount is relatively small is formed in the pixels P1L and P1R. On the other hand, since the sensitivity is high (the amount of light received is large) in the pixel P2, a photodiode PD2 where the saturated electrical charge amount is large is formed in the pixel P2. It is possible to adjust the saturated electrical charge amount in the photodiodes PD1 and PD2 by changing, for example, the density profile of an impurity diffusion layer (a laminated structure, concentration gradient, or the like). Alternatively, it is also possible to adjust the saturated electrical charge amount in the photodiodes PD1 and PD2 by changing the area of each light receiving region of the photodiodes PD1 and PD2. In this manner, it is possible to extend the dynamic range by combining and arranging the pixels P1L and P1R with a small saturated electrical charge amount and the pixel P2 with a large saturated electrical charge amount.

In addition, the exposure times may be different from each other between the pixels P1L and P1R and the pixel P2 and, since a sensitivity difference is also generated due to this, it is possible to extend the dynamic range. Furthermore, it is also possible to extend the dynamic range by a process of adding the signal which is obtained from the pixels P1L and P1R and the signal which is obtained from the pixel P2.

Eighth Embodiment

Figure 27:
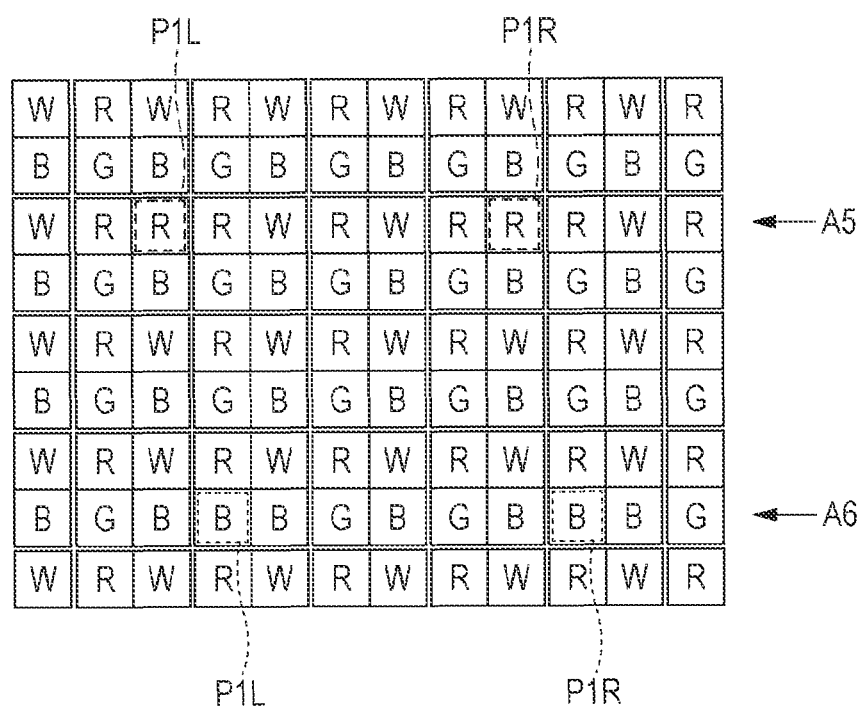
FIG. 27 is a planar schematic diagram for illustrating a solid-state imaging element according to an eighth embodiment of the present disclosure.

FIG. 27 represents a pixel array of a solid-state imaging element according to the eighth embodiment of the present disclosure. In the embodiments and the like described above, a pixel with a wavelength with a comparatively high sensitivity such as a W pixel, a G pixel, or the like is used as the pixel for detecting a phase difference; however, in the present embodiment, other wavelengths, for example, an R pixel and a B pixel are used for detecting a phase difference. For example, a pair of R pixels are used as the pixels P1L and P1R in a certain pixel row A5 and a pair of B pixels are used as the pixels P1L and P1R in another pixel row A6. As described above, since it is possible to suppress a decrease in the sensitivity in the pixels for detecting a phase difference, the sensitivity which is necessary for detecting a phase difference is easily obtained even in a case of using the R pixel or the B pixel.

Modified Example

Figure 28:
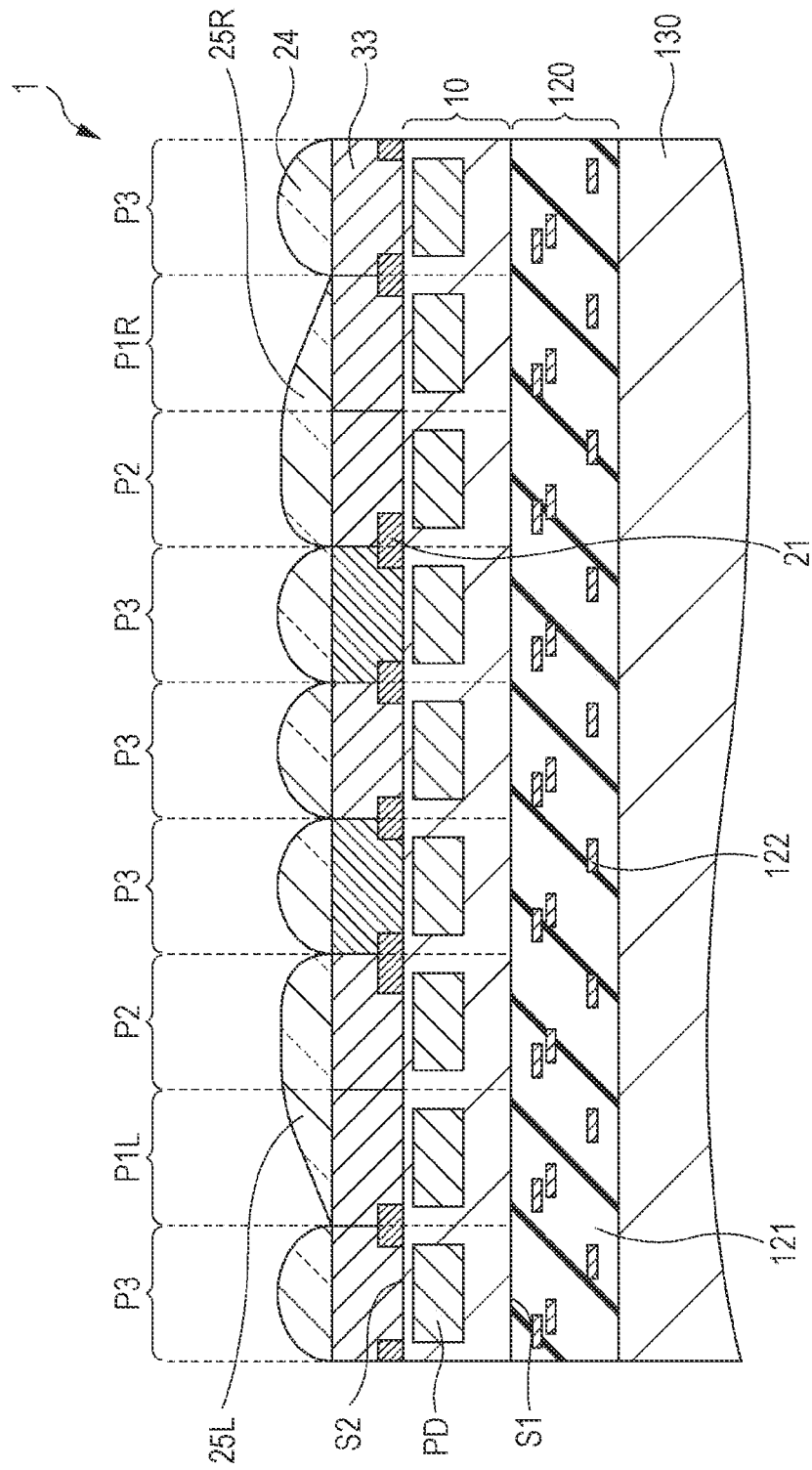
FIG. 28 is a cross-sectional diagram which represents a configuration of a solid-state imaging element according to a modified example.

FIG. 28 represents a configuration of a solid-state imaging element which is provided with a color filter layer (a color filter layer 33) according to a modified example of the first to eighth embodiments described above. In the embodiments described above, a configuration where the color filter layer (the color filter layer 23) is formed on the planarizing layer 22 is illustrated; however, as in the present modified example, the light shielding layer 21 may be embedded in the color filter layer 33. In this case, the light shielding layer 21 and the color filter layer 33 are formed on the semiconductor layer 10 without the planarizing layer 22 being interposed.

Apparatus Configuration

Figure 29:
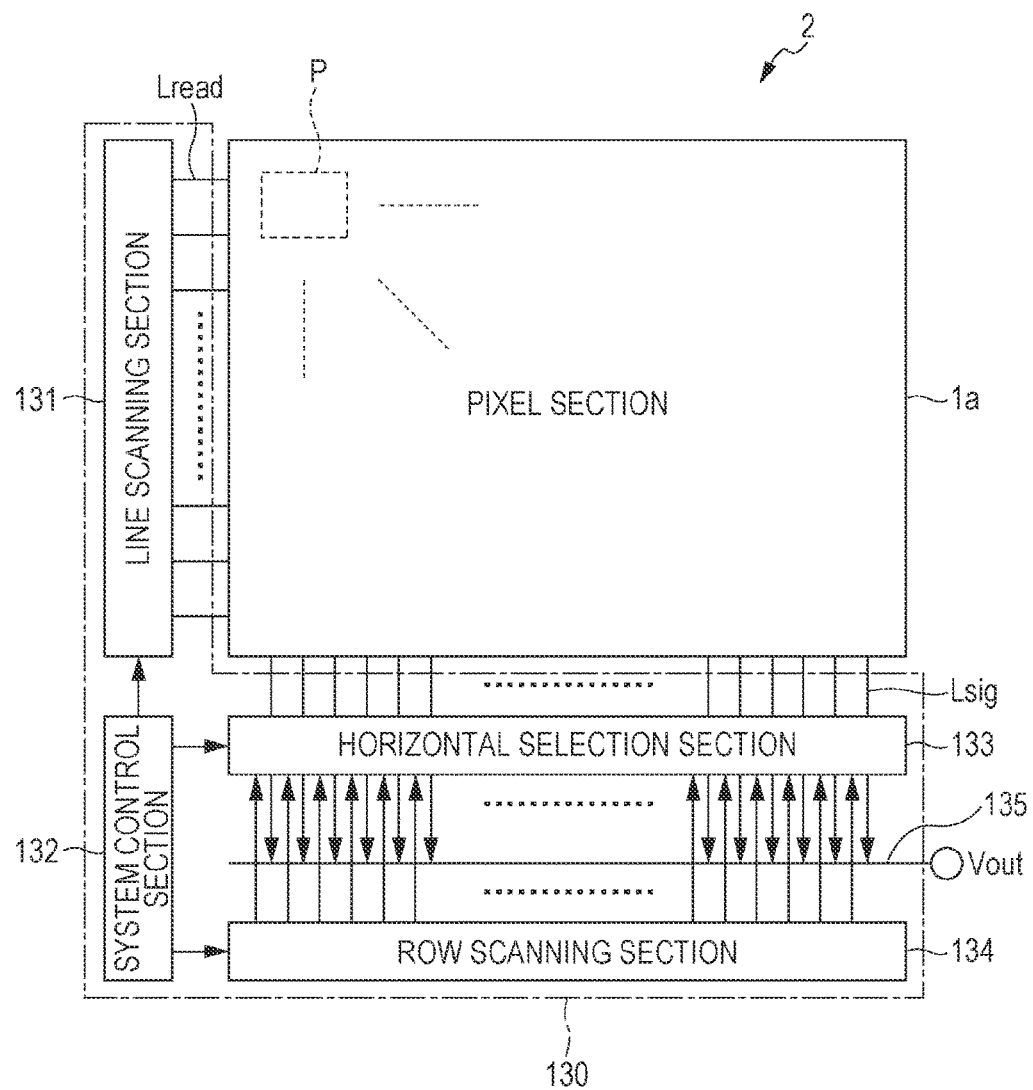
FIG. 29 is a block diagram which represents an overall configuration of an imaging apparatus which includes a solid-state imaging element.

FIG. 29 represents an overall configuration of an imaging apparatus (an imaging apparatus 2) which includes the solid-state imaging elements of the first to eighth embodiments described above. The imaging apparatus 2 has, for example, a pixel section 1a (equivalent to the solid-state imaging element 1) as an imaging area, and a circuit section 130 which includes a row scanning section 131, a horizontal selection section 133, a column scanning section 134, and a system control section 132.

The pixel section 1a has, for example, a plurality of pixels P which are two-dimensionally arranged in a matrix. In the pixels P, for example, a pixel driving line Lread (in detail, a row selection line and a reset control line) is wired for each pixel row and a vertical signal line Lsig is wired for each pixel row. The pixel driving line Lread transfers a driving signal for reading out a signal from a pixel. One end of the pixel driving line Lread is connected with an output end which corresponds to each row of the row scanning section 131.

The circuit section 130 may be formed on the same substrate as the pixel section 1a; however, for example, the circuit section 130 is laminated with the pixel section 1a and for example, the pixel section 1a is formed to be overlapped on the chip where the circuit section 130 is formed. The row scanning section 131 is a pixel driving section which is configured by a shift resistor, an address decoder, or the like and drives each pixel P of the pixel section 1a, for example, in row units. A signal which is output from each pixel P of the pixel row which is selected and scanned by the row scanning section 131 is supplied to the horizontal selection section 133 through each of the vertical signal lines Lsig. The horizontal selection section 133 is configured by an amplifier, a horizontal selection switch, or the like which is provided for each vertical signal line Lsig. The column scanning section 134 is configured by a shift resistor, an address decoder, or the like and drives each horizontal selection switch of the horizontal selection section 133 in sequence while scanning. According to the selection scanning by the column scanning section 134, the signals of each pixel which are transferred through each of the vertical signal lines Lsig are output to a horizontal signal line 135 in sequence and transferred to the outside of a substrate 11 through the horizontal signal line 135.

The system control section 132 receives a clock from the outside, data which instructs an operation mode, or the like and also outputs data such as internal information of the solid-state imaging element 1. The system control section 132 also has a timing generator which generates various types of timing signals and performs driving control of the row scanning section 131, the horizontal selection section 133, the column scanning section 134, and the like based on the various types of the timing signals which are generated by the timing generator.

Application Example

Figure 30:
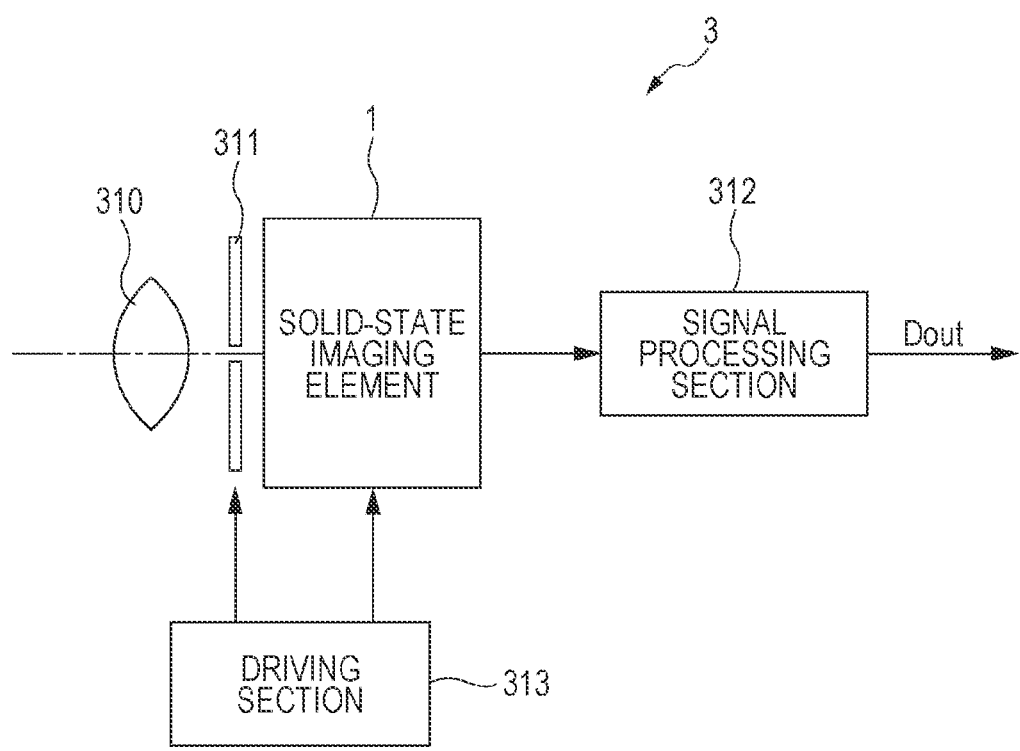
FIG. 30 is a block diagram which represents a schematic configuration of an electronic device which uses a solid-state imaging element.

It is possible to apply the solid-state imaging element of the embodiments and the like described above (below, the solid-state imaging element 1 is given as an example) to various types of electronic devices which have an imaging function such as camera systems such as digital still cameras or video cameras or mobile phones which have an imaging function. FIG. 30 shows a schematic configuration of an electronic device 3 (a camera) as one example thereof. The electronic device 3 is, for example, a video camera which is able to image a static image or a movie and has the solid-state imaging element 1, an optical system (an optical lens) 310, a shutter apparatus 311, a driving section 313 which drives the solid-state imaging element 1 and the shutter apparatus 311, and a signal processing section 312.

The optical system 310 guides image light (incident light) from a subject to the solid-state imaging element 1. The optical system 310 may be configured by a plurality of optical lenses. The shutter apparatus 311 controls a light irradiation period and a light shielding period for the solid-state imaging element 1. The driving section 313 controls a transferring operation of the solid-state imaging element 1 and a shutter operation of the shutter apparatus 311. The signal processing section 312 performs various types of signal processes with respect to a signal which is output from the solid-state imaging element 1. A video signal Dout after signal processing is stored in a storage medium such as a memory or output to a monitor or the like.

Above, description was given using the embodiments and the modified examples; however, the contents according to an embodiment of the present disclosure are not limited to the embodiments and the like described above and various modifications are possible. For example, in the embodiments and the like described above, description was given using an example of a case in which an electron out of a pair of an electron and a positive hole generated in a photodiode is extracted as a signal charge; however, the positive hole may be extracted as the signal charge without being limited to the electron. In addition, the effects described in the embodiments and the like described above are examples and may be other effects, or may further include other effects.

Here, the present disclosure may have a configuration as below.

(1)

A solid-state imaging element including a plurality of pixels which are two-dimensionally arranged and each of which includes a photoelectric conversion element, and a microlens which is provided on one or two or more first pixels out of the plurality of the pixels, in which an optical axis of the microlens extends inside a second pixel which is adjacent to the first pixel.

(2)

The solid-state imaging element according to (1) described above, in which the microlens is formed over the first pixel and the second pixel.

(3)

The solid-state imaging element according to (2) described above, in which the microlens has a convex surface on a light incident side and the convex surface includes an inclined surface in a portion which faces the first pixel.

(4)

The solid-state imaging element according to (3) described above, in which the inclined surface is inclined from a vicinity of a boundary of the first pixel and the second pixel to an end section of the first pixel.

(5)

The solid-state imaging element according to any of (1) to (4) described above, in which the first pixel and the second pixel have color filters with identical colors.

(6)

The solid-state imaging element according to any of (1) to (5) described above, in which the plurality of the pixels include the first pixels, the second pixels, and other third pixels, the first pixels are pixels for detecting a phase difference, and the second pixels and the third pixels are pixels for generating an image.

(7)

The solid-state imaging element according to (6) described above, further including a first light shielding layer which has an opening section facing each of the photoelectric conversion elements of the first pixels, the second pixels, and the third pixels, in which a light shielding area due to the first light shielding layer is large in the second pixel compared to the third pixel.

(8)

The solid-state imaging element according to (6) described above, in which the microlens is provided over a pixel group formed of three or more pixels and one or two or more selective pixels out of the pixel group are used as the first pixels and other pixels are used as the second pixels.

(9)

The solid-state imaging element according to (6) described above, in which the plurality of the pixels have a pixel array which is two-dimensionally arranged along two directions which are each rotated by 45° from a horizontal direction and a vertical direction and a pair of pixels which have color filters with identical colors to each other in the pixel array are the first pixels.

(10)

The solid-state imaging element according to (6) described above, in which the photoelectric conversion element is formed by being embedded inside a semiconductor layer for each of the pixels and a second light shielding layer is provided in the region between the photoelectric conversion elements of the semiconductor layer.

(11)

The solid-state imaging element according to (6) described above, in which a cross-section shape of the microlens is different between a central section and a peripheral section inside an arrangement surface of the plurality of the pixels.

(12)

The solid-state imaging element according to (6) described above, in which any of a pair of pixels for detecting a phase difference is the first pixel in the central section inside the arrangement surface of the plurality of the pixels.

(13)

The solid-state imaging element according to (12) described above, in which, in the peripheral section inside the arrangement surface of the plurality of the pixels, one pixel of a pair of pixels for detecting a phase difference is the first pixel and the third pixel is used for the other pixel.

(14)

The solid-state imaging element according to any of (1) to (13) described above, in which one of or both of sensitivity and a saturated electrical charge amount are different between the first pixel and the second pixel.

(15)

A solid-state imaging element including a plurality of pixels which are two-dimensionally arranged and each of which includes a photoelectric conversion element, and a microlens which is provided on one or two or more first pixels out of the plurality of the pixels, in which the microlens has a convex surface on a light incident side and the convex surface includes an inclined surface in a portion which faces the first pixel.

(16)

A method for manufacturing a solid-state imaging element, the method including forming a plurality of pixels which are two-dimensionally arranged and each of which includes a photoelectric conversion element, and forming a microlens on one or two or more first pixels out of the plurality of the pixels, in which an optical axis of the microlens extends inside a second pixel which is adjacent to the first pixel.

(17)

The method for manufacturing a solid-state imaging element according to (16) described above, in which the microlens has a convex surface on a light incident side and the convex surface includes an inclined surface in a portion which faces the first pixel.

(18)

The method for manufacturing a solid-state imaging element according to (17) described above, in which in the forming the microlens, after forming a resin layer on the first pixel and the second pixel, the resin layer is reflowed using a photoresist, and the photoresist has a pattern which is more finely divided in a portion which faces the first pixel than in a portion which faces the second pixel.

(19)

The method for manufacturing a solid-state imaging element according to (17) described above, in which in the forming the microlens, after forming a resin layer on the first pixel and the second pixel, the resin layer is molded using a metal mold.

(20)

An electronic device including a solid-state imaging element which is provided with a plurality of pixels which are two-dimensionally arranged and each of which includes a photoelectric conversion element, and a microlens which is provided on one or two or more first pixels out of the plurality of the pixels, in which an optical axis of the microlens extends inside a second pixel which is adjacent to the first pixel.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging element comprising:
   a plurality of pixels arranged in a two-dimensional array, each pixel of the plurality of pixels including a photoelectric conversion element;
   a first pixel of the plurality of pixels and a second pixel of the plurality of pixels forming a pair of phase difference detection pixels, wherein a phase difference is detected based on a signal obtained from each of the first and second pixels;
   third and fourth pixels of the plurality of pixels between the first and second pixels of the plurality of pixels;
   a first microlens over both the first pixel of the plurality of pixels and the third pixel of the plurality of the pixels;
   a second microlens over both the second pixel of the plurality of pixels and the fourth pixel of the plurality of pixels; and
   a light-shielding film provided between the first microlens and both of the first and third pixels of the plurality of pixels and the second microlens and both of the second and fourth pixels of the plurality of pixels, the light-shielding film including a continuous opening above both of the first and third pixels of the plurality of pixels and above both of the second and fourth pixels of the plurality of pixels,
   wherein,
      the first pixel of the plurality of pixels is adjacent to the third pixel of the plurality of pixels,
      the second pixel of the plurality of pixels is adjacent to the fourth pixel of the plurality of pixels, and
      the third and fourth pixels of the plurality of pixels are pixels configured to generate an image.

2. The imaging element according to claim 1, wherein the first microlens includes a convex surface at a light-incident side, the convex surface including an inclined surface in a portion which faces the first pixel.

3. The imaging element according to claim 2, wherein the inclined surface is inclined from a vicinity of a boundary of the first pixel of the plurality of pixels and the third pixel of the plurality of pixels to an end section of the first pixel of the plurality of pixels.

4. The imaging element according to claim 1, wherein the first pixel of the plurality of pixels and the third pixel of the plurality of pixels include color filters with identical colors.

5. The imaging element according to claim 1, wherein the first microlens is provided over a pixel group formed of three or more pixels of the plurality of pixels and at least one pixel out of the pixel group is used for detecting a phase difference.

6. The imaging element according to claim 1, wherein the plurality of the pixels are arranged in a pixel array which is two-dimensionally arranged along two directions which are each rotated by 45° from a horizontal direction and a vertical direction, and a pair of pixels which have color filters with identical colors to each other in the pixel array are used for detecting a phase difference.

7. The imaging element according to claim 1, wherein the photoelectric conversion element is embedded inside a semiconductor layer and the light-shielding layer is provided in a region between the photoelectric conversion element of the semiconductor layer.

8. The imaging element according to claim 1, wherein a cross-section shape of the first microlens is different between a central section and a peripheral section inside an arrangement surface of the plurality of the pixels.

9. The imaging element according to claim 1, wherein a pair of pixels for detecting a phase difference includes the first and second pixels in a central section inside an arrangement surface of the plurality of the pixels.

10. The imaging element according to claim 1, wherein one of or both of sensitivity and a saturated electrical charge amount are different between the first pixel of the plurality of pixels and the third pixel of the plurality of pixels.

11. An electronic device comprising:
    an imaging element including:
       a plurality of pixels arranged in a two-dimensional array, each pixel of the plurality of pixels including a photoelectric conversion element,
       a first pixel of the plurality of pixels and a second pixel of the plurality of pixels forming a pair of phase difference detection pixels, wherein a phase difference is detected based on a signal obtained from each of the first and second pixels,
       third and fourth pixels of the plurality of pixels between the first and second pixels of the plurality of pixels,
       a first microlens over both the first pixel of the plurality of pixels and a the third pixel of the plurality of the pixels,
       a second microlens over both the second pixel of the plurality of pixels and the fourth pixel of the plurality of pixels, and
       a light-shielding film provided between the first microlens and both of the first and third pixels of the plurality of pixels and the second microlens and both of the second and fourth pixels of the plurality of pixels, the light-shielding film including a continuous opening above both of the first and third pixels of the plurality of pixels and above both of the second and fourth pixels of the plurality of pixels,
    wherein,
       the first pixel of the plurality of pixels is adjacent to the third pixel of the plurality of pixels,
       the second pixel of the plurality of pixels is adjacent to the fourth pixel of the plurality of pixels, and
       the second and fourth pixels of the plurality of pixels are pixels configured to generate an image,
       an optical axis of the first microlens extends inside the second pixel of the plurality of pixels, and
       an optical axis of the second microlens extends inside the fourth pixel of the plurality of pixels.

12. The imaging element according to claim 1, further comprising a white filter disposed between the first microlens and the first and third pixels of the plurality of pixels.

13. The imaging element according to claim 1, wherein an optical axis of the first microlens extends inside the second pixel of the plurality of pixels, and wherein an optical axis of the second microlens extends inside the fourth pixel of the plurality of pixels.

* * * * *